(12) United States Patent
Iwasaki et al.

(10) Patent No.: US 7,951,699 B2
(45) Date of Patent: May 31, 2011

(54) METHOD OF MANUFACTURING SEMICONDUCTOR DEVICE

(75) Inventors: Toshihiro Iwasaki, Tokyo (JP); Shiori Idaka, Tokyo (JP); Yasumichi Hatanaka, Tokyo (JP)

(73) Assignee: Renesas Electronics Corporation, Kanagawa (JP)

( * ) Notice: Subject to any disclaimer, the term of this patent is extended or adjusted under 35 U.S.C. 154(b) by 916 days.

(21) Appl. No.: 11/637,097

(22) Filed: Dec. 12, 2006

(65) Prior Publication Data
US 2007/0141750 A1 Jun. 21, 2007

(30) Foreign Application Priority Data
Dec. 15, 2005 (JP) .................................. 2005-361371

(51) Int. Cl.
*H01L 21/603* (2006.01)
*H01L 33/62* (2006.01)
(52) U.S. Cl. ........................................ 438/613; 438/108
(58) Field of Classification Search .................. None
See application file for complete search history.

(56) References Cited

U.S. PATENT DOCUMENTS

| | | | | |
|---|---|---|---|---|
| 6,486,411 B2 * | 11/2002 | Miura et al. | ................. | 174/256 |
| 6,742,701 B2 * | 6/2004 | Furuno et al. | ................. | 228/205 |
| 7,214,622 B2 * | 5/2007 | Sugiyama et al. | ............ | 438/689 |
| 2007/0045788 A1 * | 3/2007 | Suzuki et al. | ................. | 257/666 |

FOREIGN PATENT DOCUMENTS

| | | |
|---|---|---|
| JP | 03-108734 | 5/1991 |
| JP | 11-163036 | 6/1999 |
| JP | 2000-012893 | 1/2000 |
| JP | 2002-164498 | 6/2002 |
| JP | 2003-133508 | 5/2003 |
| JP | 2004-79685 | 3/2004 |
| JP | 2004-146728 * | 5/2004 |
| JP | 2005-322822 | 11/2005 |

OTHER PUBLICATIONS

Japanese Office Action, with English translation, issued in Japanese Patent Application No. 2005-361371, mailed Feb. 1, 2011.

* cited by examiner

*Primary Examiner* — Zandra Smith
*Assistant Examiner* — Pamela E Perkins
(74) *Attorney, Agent, or Firm* — McDermott Will & Emery LLP

(57) ABSTRACT

A method of manufacturing a semiconductor device includes a first step of forming solder film on metal posts of a mother chip, a second step of forming solder balls after the first step by printing a solder paste on the mother chip and heating the mother chip so that the solder paste is reflowed, a third step of bonding the metal posts of the mother chip and metal posts of a daughter chip to each other in a thermocompression bonding manner by means of the solder film after the second step, and a fourth step of flip-chip-connecting the mother chip on a circuit substrate by using the solder balls. In the second step, the mother chip is heated in a nitrogen atmosphere in which the oxygen concentration is 500 ppm or less.

4 Claims, 34 Drawing Sheets

SCRUBBING OR ULTRASONIC VIBRATION

LIFT

METHOD OF MANUFACTURING SEMICONDUCTOR DEVICE

BACKGROUND OF THE INVENTION

1. Field of the Invention

The present invention relates to a method of manufacturing a semiconductor device by bonding metal posts of a mother chip and metal posts of a daughter chip to each other by means of solder film in a thermocompression bonding manner and, more particularly, to a semiconductor device manufacturing method which enables prevention of the occurrence of imperfect contact between a mother chip and a daughter chip.

2. Background Art

In recent years, semiconductor devices having a chip-on-chip (COC) structure in which a daughter chip is flip-chip-connected to a mother chip and having the mother chip flip-chip-connected to a circuit substrate have been proposed. In flip-chip connection between the mother chip and the daughter chip, metal posts of the two chips are bonded to each other in a thermocompression bonding manner by means of solder film. The proposed semiconductor devices include ones in which solder film is formed on the surfaces of each of the group of metal posts on a mother chip and the group of metal posts on a daughter chip (see, for example, Japanese Patent Laid-Open Nos. 2004-79685 and 2004-146728) and ones in which Au film is formed on one of the groups of metal posts on a mother chip and a daughter chip, while solder film is formed on the other group of metal posts (see, for example, Japanese Patent Laid-Open Nos. 2002-164498 and 2003-133508).

In the case of forming solder film on metal posts on a mother chip, thereafter forming solder balls having a large diameter on peripheral electrodes on the mother chip, and bonding the metal posts on the mother chip and metal posts on a daughter chip to each other in a thermocompression bonding manner by means of the solder film, thick oxide film having a thickness of 10 to 20 nm is formed in the surface of the solder film exposed on each metal post in regions where no solder balls are formed, by reflowing for forming the solder balls. Therefore, there is a problem that, at the time of flip-chip connection of the daughter chip to the mother chip, the thick oxide film in the surface of the solder film cannot be broken and failure of connection between the mother chip and the daughter chip occurs.

SUMMARY OF THE INVENTION

In view of the above-described problem, an object of the present invention is to provide a semiconductor device manufacturing method which enables prevention of failure of connection between a mother chip and a daughter chip.

According to one aspect of the present invention, a method of manufacturing a semiconductor device includes a first step of forming solder film on metal posts of a mother chip, a second step of forming solder balls after the first step by printing a solder paste on the mother chip and heating the mother chip so that the solder paste is reflowed, a third step of bonding the metal posts of the mother chip and metal posts of a daughter chip to each other in a thermocompression bonding manner by means of the solder film after the second step, and a fourth step of flip-chip-connecting the mother chip on a circuit substrate by using the solder balls. In the second step, the mother chip is heated in a nitrogen atmosphere in which the oxygen concentration is 500 ppm or less.

The present invention enables prevention of failure of connection between a mother chip and a daughter chip.

Other and further objects, features and advantages of the invention will appear more fully from the following description.

DETAILED DESCRIPTION OF THE PREFERRED EMBODIMENTS

First Embodiment

Figure 1:
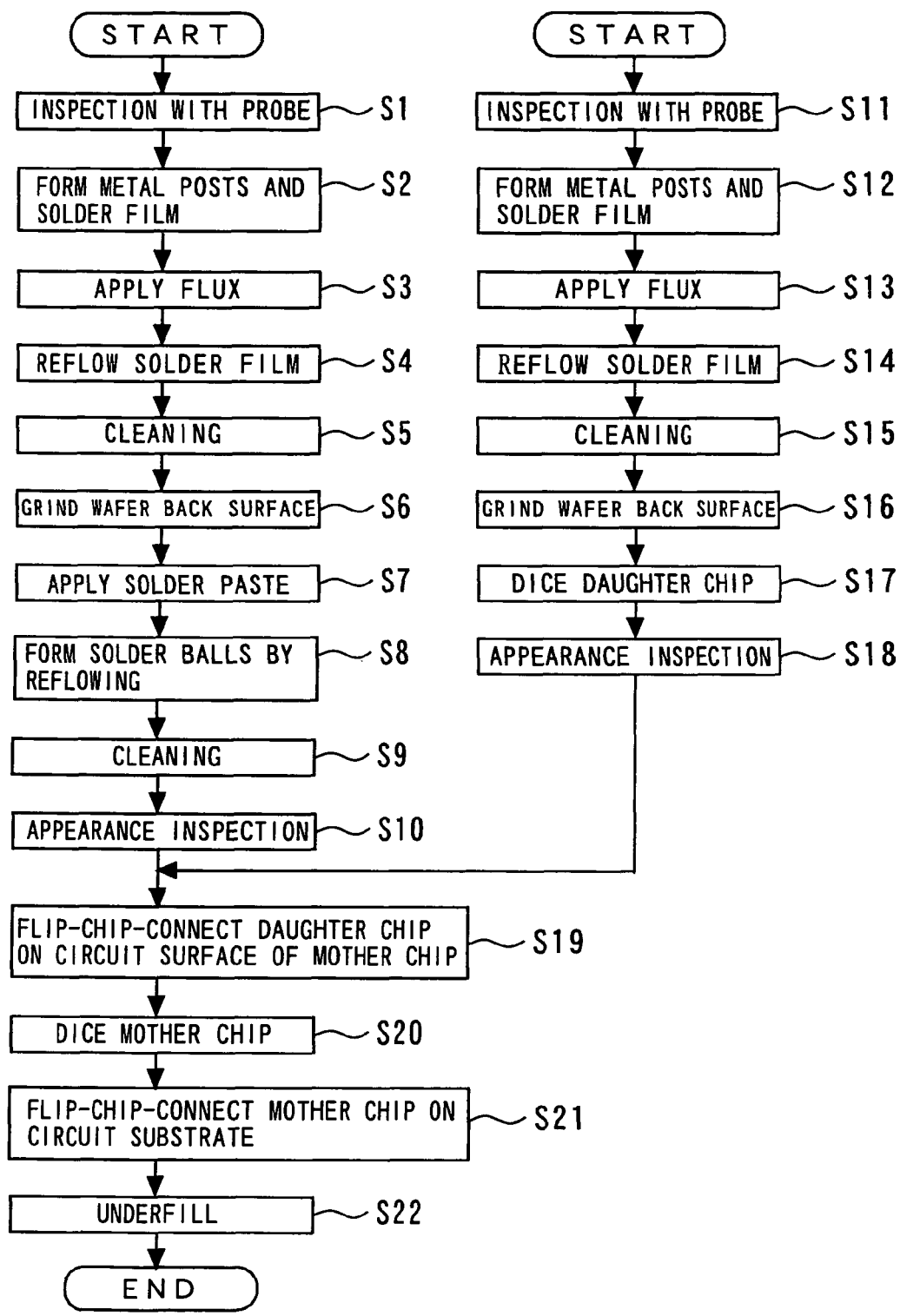
FIG. 1 is a flowchart showing a semiconductor device manufacturing method according to a first embodiment of the present invention.

A method of manufacturing a semiconductor device according to a first embodiment of the present invention will be described with reference to the flowchart of FIG. 1 and other figures.

Figure 2A:
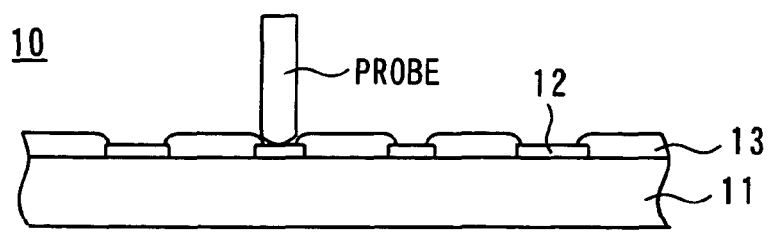
FIGS. 2A to 2E are sectional views showing a process of forming a mother chip according to the first embodiment of the present invention.

A process of forming a mother chip 10 will first be described. As shown in FIG. 2A, Al electrodes 12 are first formed on a substrate 11 (circuit surface) and other regions are covered, for example, with a surface protective film 13 formed of silicon nitride film and polyimide film. An inspection is made by applying a probe to the Al electrodes 12 (step S1). This inspection is made on each of a plurality of mother chips 10 formed on the wafer, and a wafer map indicating the nondefective/defective state of each mother chip 10 on the wafer is made.

Figure 2B:
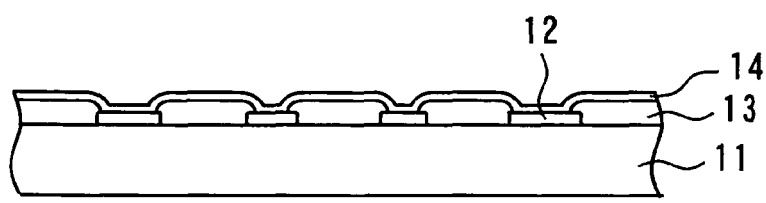
Figure 2C:
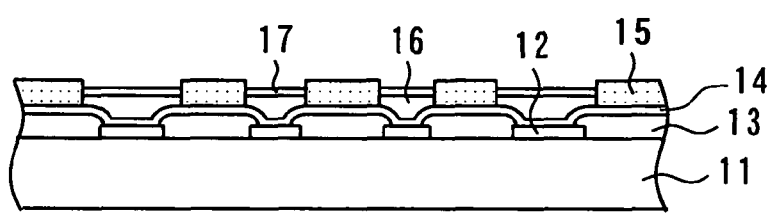
Figure 2D:
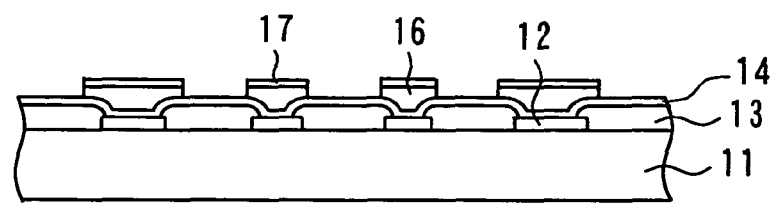

Subsequently, as shown in FIG. 2B, barrier metal 14 in multilayer form comprising Ti, Cu, Ni, Cr and W for example is formed on the entire surface by a sputtering technique or a plating technique for example. As shown in FIG. 2C, a resist 15 having openings corresponding to regions where the Al electrodes 12 exist is formed, and metal posts 16 are formed by filling the openings in the resist 15 with Ni film by an electrolytic plating technique using the barrier metal 14 as a feeder film. Solder film 17 formed of one of Sn, Ag and Cu and the like or a combination of these is formed on the metal posts 16 (step S2). The material of the solder film 17 in this embodiment is prepared by adding 1.5 wt % of Ag to Sn. The composition of the solder is not limited to this. For example, Si—Bi solder film, Sn film or Sn—Pb eutectic solder film may be used. As the solder film 17, however, a metal having a melting point lower than that of the metal posts 16 is preferred. Therefore, a metal film containing Sn is preferred. The resist 15 is removed after the formation of the solder film 17, as shown in FIG. 2D. The material of the metal posts 16 is not limited to Ni. Cu for example may be used as the material of the metal posts 16. The thickness of the metal posts 16 may be about 10 to 50 μm if the material is Cu, and may be about 1 to 5 μm if the material is Ni. In this embodiment, Ni film having a film thickness of 5 to 10 μm is used as the metal posts 16. The pitch between the metal posts 16 is 20 to 100 μm. The thickness of the solder film 17 is about 3 to 15 μm. If the metal posts 16 are unnecessary, the solder film 17 may be formed on the barrier metal 14 without forming the metal posts 16.

Figure 2E:
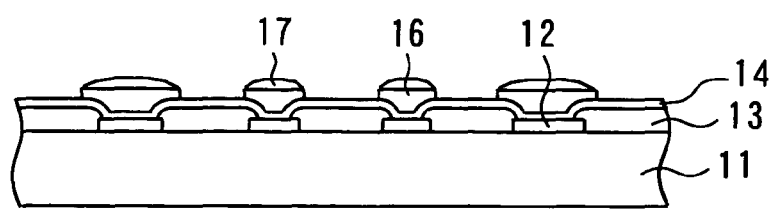

Subsequently, a flux is applied to the entire wafer surface (step S3) and is reflowed (molten) in an environment in an $N_2$ reflow furnace, an $N_2+H_2$ reflow furnace or the like in which surface oxidation is limited, as shown in FIG. 2E (step S4). The adhesion between the solder film 17 and the metal posts 16 is thereby improved to increase the strength of the solder film 17. Thereafter, cleaning is performed to remove the flux (step S5). Cleaning may be performed under a cleaning condition not particularly specified. In a case where a rosin flux is used, however, it is preferable to use an organic-solvent-based cleaner such as alcohol. In a case where a water-soluble flux is used, it is preferable to use pure water or the like. Use of Ni film as the material of the metal posts 16 ensures that metal diffusion from the metal posts 16 to the solder film 17 is limited in the step of melting the solder film 17 to limit the bad influence on the composition of the solder film 17.

Figure 3A:
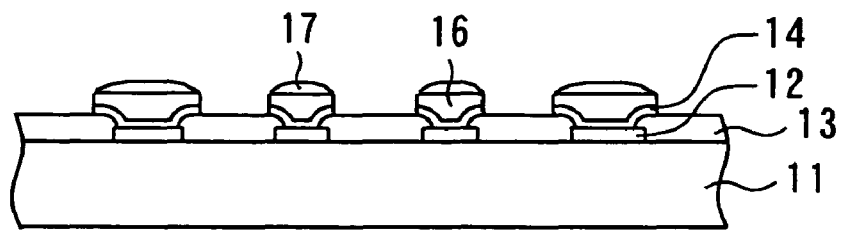
FIGS. 3A to 3D are sectional views showing the process of forming the mother chip according to the first embodiment of the present invention.
Figure 3B:
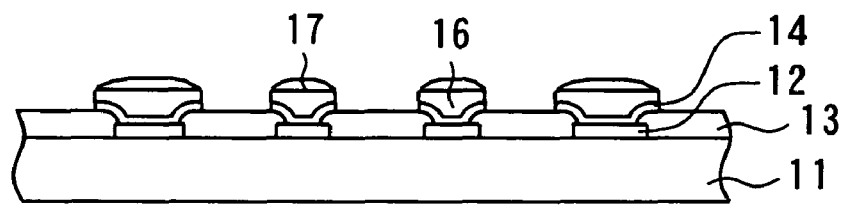

Subsequently, as shown in FIG. 3A, the barrier metal 14 is etched by anisotropic etching, with the metal posts 16 used as a mask. As shown in FIG. 3B, grinding of the back surface of the wafer (back grinding) is performed until the wafer thickness is reduced to a predetermined value of, for example, 200 to 600 μm (step S6). As the wafer back surface grinding (back grinding) step, a method of mechanically grinding the wafer back surface with a rotating grinding wheel, a method of reducing the thickness by chemically solving the wafer back surface by using an etching solution or the like or a method of reducing the thickness by using both a mechanical means and a chemical means may be used properly. Preferably, the wafer back surface grinding step is performed in a state where a back grinding tape provided as a resin protective film is adhered to the wafer main surface for the purpose of protecting the wafer main surface. Wafer back surface grinding may be performed in advance before formation of the barrier metal for example, if there is no problem in terms of handling, etc.

Figure 3C:
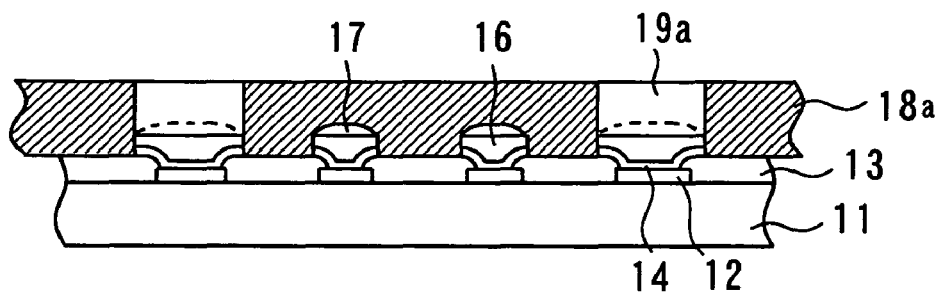

Subsequently, as shown in FIG. 3C, a metal mask 18a having openings corresponding to regions where solder balls (described below) are to be formed is formed, and a solder paste 19a is printed on the mother chip 10 by filling the openings of the metal mask 18a with the solder paste (step S7). The solder paste has fine solder particles dispersed and mixed in a flux. In the reflow step described below, the oxide film in the surfaces of the solder particles is effectively reduced by the reducing action of hydrogen ions liberated from an active component of the flux. The composition of the solder particles contained in the solder paste is Sn-1% Ag-0.5% Cu in this embodiment. However, the composition is not limited to this.

Figure 3D:
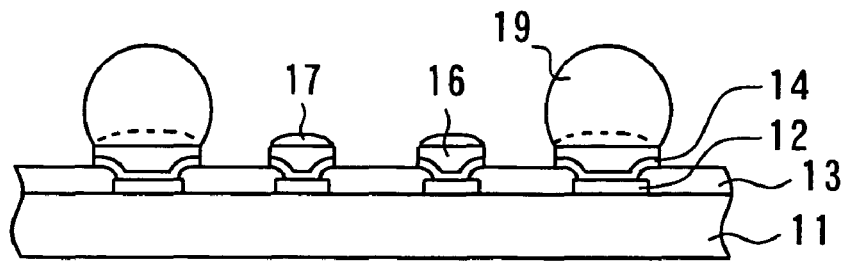

Subsequently, as shown in FIG. 3D, the metal mask 18a is removed and the mother chip 10 is heated in a nitrogen atmosphere in which the oxygen concentration is 500 ppm or less to reflow (melt) the solder paste 19a, thereby forming solder balls 19 (step S8). The solder paste for forming the solder balls 19 contains the flux having reducing action. By the reducing action of the flux, the metal oxide films in the surfaces of the solder particles in the paste and the surface of the substrative solder film 17 are removed to ensure good connection between the solder balls 19 and the substrative metal posts 16. In ordinary cases, the step of ref lowing a solder paste containing a flux as described above is performed by means of a lowest-cost heat treatment in the atmosphere. In this embodiment, however, the step of ref lowing the solder balls 19 is performed in a situation in which the solder film 17 is already formed on the metal posts on which no solder balls 19 are to be formed. Therefore, if the reflow method based on the ordinary heat treatment in the atmosphere is used, there is a possibility of a thick oxide film having a thickness of, for example, 10 nm or more being formed in the exposed surface of the solder film 17 to cause a reduction in solder junction strength in the chip-on-chip connection step performed afterward. In this embodiment, in consideration of this special problem, in the reflow step of the solder balls 19, it is preferable to perform a heat treatment for reflowing the solder balls 19 in a low-oxidation atmosphere in which the oxygen concentration of 500 ppm or less in order to prevent formation of a thick oxide film in the solder film 17 surfaces exposed on the metal post on which no solder balls 19 are to be formed.

If ref lowing for forming the solder balls 19 is performed in a nitrogen atmosphere as described above, the film thickness of the oxide film in the surface of the solder film 17 can be limited to several nanometers. As a measure to prevent formation of a thick oxide film in the solder film 17 surface exposed on the metal posts on which no solder balls 19 are to be formed, heat treatment may be performed in a state where the flux having reducing action is applied on the exposed solder film 17 after application of the solder paste and before the step of ref lowing the solder balls 19. A method of applying the flux on the exposed solder film 17 in such a manner that, for example, the flux is partially applied only on the exposed solder film 17 may also be used. However, it is easiest to apply the flux to the entire wafer surface including the exposed solder film 17 surface by spin coating. In this embodiment, Pb-free solder consisting of Sn-1% Ag-0.5% Cu is used for the solder balls 19. However, this solder is not exclusively used. For example, a lead-free solder containing Sn, Au, Cu or the like or an Sn—Pb eutectic solder can be used. In this embodiment, the ball diameter is 120 μm and the ball height is 80 μm.

Cleaning (step S9) and an appearance inspection (step S10) are thereafter performed. The mother chip 10 is formed by the above-described process.

Figure 4A:
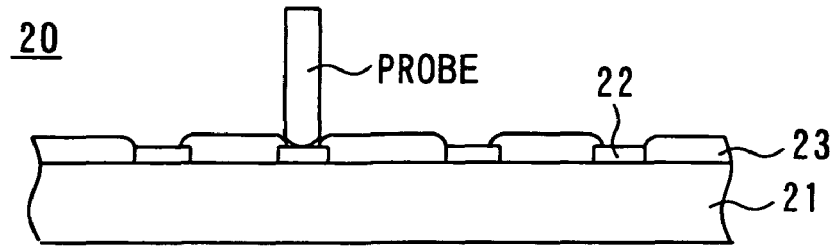
FIGS. 4A to 4D are sectional views showing a process of forming a daughter chip according to the first embodiment of the present invention.

A process of forming a daughter chip 20 will next be described. As shown in FIG. 4A, Al electrodes 22 are first formed on a substrate 21 (circuit surface) and other regions are covered with surface protective film 23. An inspection is made by applying a probe to the Al electrodes 22 (step S11). This inspection is made on each of a plurality of daughter chips 20 formed on the wafer, and a wafer map indicating the nondefective/defective state of each daughter chip 20 on the wafer is made.

Figure 4B:
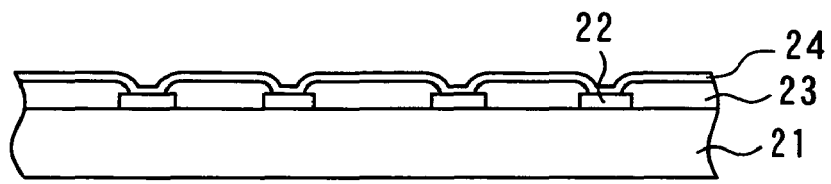
Figure 4C:
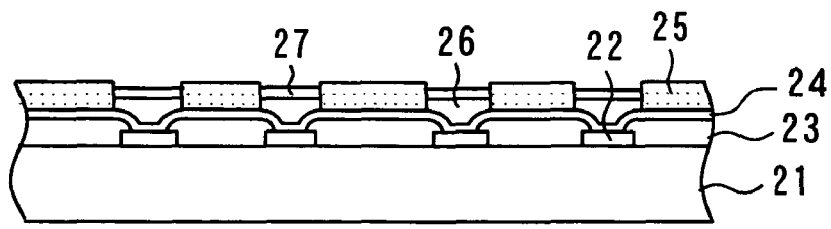
Figure 4D:
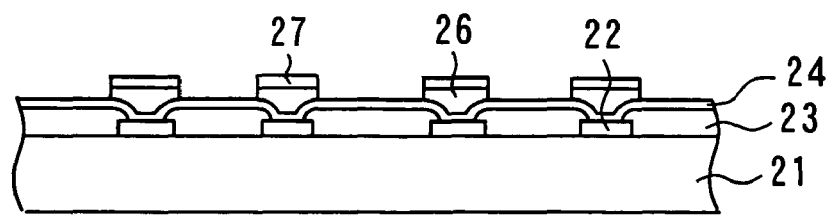

Subsequently, as shown in FIG. 4B, barrier metal 24 in multilayer form comprising Ti, Cu, Ni, Cr and W for example is formed on the entire surface by a sputtering technique or a plating technique for example. As shown in FIG. 4C, a resist 25 having openings corresponding to regions where the Al electrodes 22 exist is formed, and metal posts 26 are formed by filling the openings in the resist 25 with Ni film by an electrolytic plating technique using the barrier metal 24 as a feeder film. Solder film 27 formed of one of Sn, Ag and Cu and the like, a combination of these or an Sn—Pb eutectic solder is formed on the metal posts 26 (step S12). In this embodiment, Sn-1.5Ag solver film is used as the solder film 27. Thereafter, the resist 25 is removed, as shown in FIG. 4D. The material of the metal posts 26 is not limited to Ni. Cu may be used as the material of the metal posts 26. The thickness of the metal posts 26 may be about 10 to 50 μm if the material is Cu, and may be about 1 to 5 μm if the material is Ni. In this embodiment, Ni film having a film thickness of 1 to 5 μm is used as the metal posts 26. The pitch between the metal posts 26 is 20 to 100 μm. The thickness of the solder film 27 is about 3 to 15 μm. If the metal posts 26 are unnecessary, the solder film 27 may be formed on the barrier metal 24 without forming the metal posts 26.

Figure 5A:
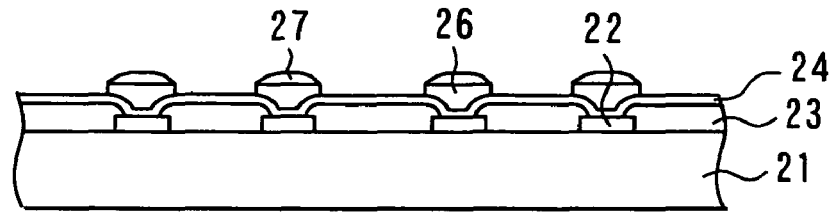
FIGS. 5A to 5D are sectional views showing the process of forming the daughter chip according to the first embodiment of the present invention.

Subsequently, a flux is applied to the entire wafer surface (step S13) and is reflowed in an environment in an $N_2$ reflow furnace, an $N_2+H_2$ reflow furnace or the like in which surface oxidation is limited, as shown in FIG. 5A (step S14). The adhesion between the solder film 27 and the metal posts 26 is thereby improved to increase the strength of the solder film 27. Thereafter, cleaning is performed to remove the flux (step S15). Use of Ni film as the material of the metal posts 26 ensures that metal diffusion from the metal posts 26 to the solder film 27 is limited in the step of reflowing the solder film 27 to limit the bad influence on the composition of the solder film 27. In a case where Cu film is used as the metal posts 26, a large amount of Cu is diffused into the solder film 27 when the step of reflowing the solder film 27 is performed, and Cu exceeding a solid solution limit causes segregation of a large amount of Cu-rich alloy on the solder surface when the solder film 27 solidifies. In a subsequent step, there is a possibility of a thick native oxide film of the Cu alloy being formed in the solder surface to reduce the reliability at the time of joining to the mother chip 10 described below. In a case where Cu film is used as the metal posts 26, therefore, it is preferable to avoid performing any step of melting the solder film 27 before joining to the mother chip 10.

Figure 5B:
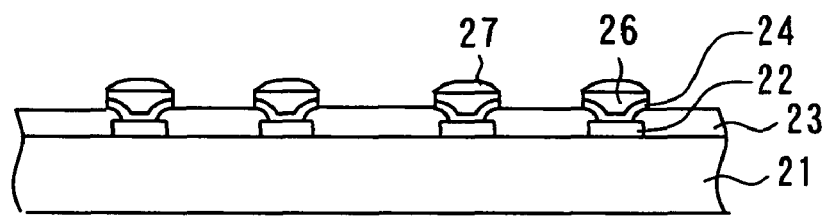
Figure 5C:
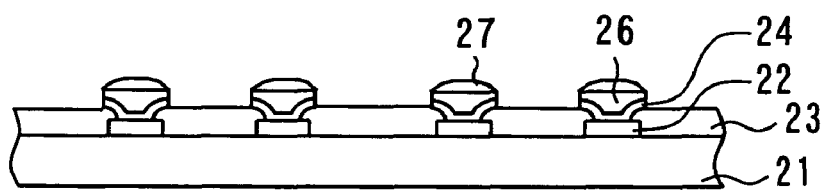

Subsequently, as shown in FIG. 5B, the barrier metal 24 is etched by anisotropic etching, with the metal posts 26 used as a mask. As shown in FIG. 5C, wafer back surface grinding is performed until the wafer thickness is reduced to a predetermined value of, for example, 30 to 50 μm (step S16).

Figure 5D:
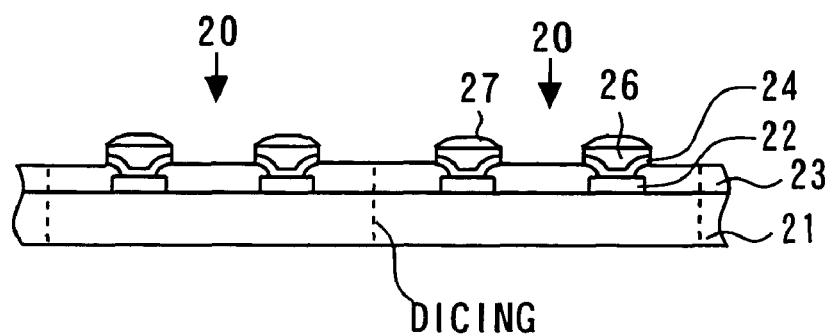

Subsequently, as shown in FIG. 5D, the plurality of daughter chips 20 formed on the wafer are individually separated by dicing (step S17). An appearance inspection is thereafter performed (step S18). The daughter chip 20 is formed by the above-described process. An active element such as a memory may be used as the daughter chip 20, and a combination of an active element and a passive element such as a chip capacitor may be mounted as the daughter chip 20.

A process of flip-chip-connecting the daughter chip on the circuit surface of the mother chip and a process of flip-chip-connecting the mother chip to a circuit substrate will next be described.

The daughter chip 20 recognized as a nondefective through the probe test in step S11 and the appearance inspection in step S18 is flip-chip-connected on the circuit surface of each of a plurality of mother chips 10 on the wafer recognized as a nondefective through the probe test in step S1 and the appearance inspection in step S6 (step S19).

Figure 6:
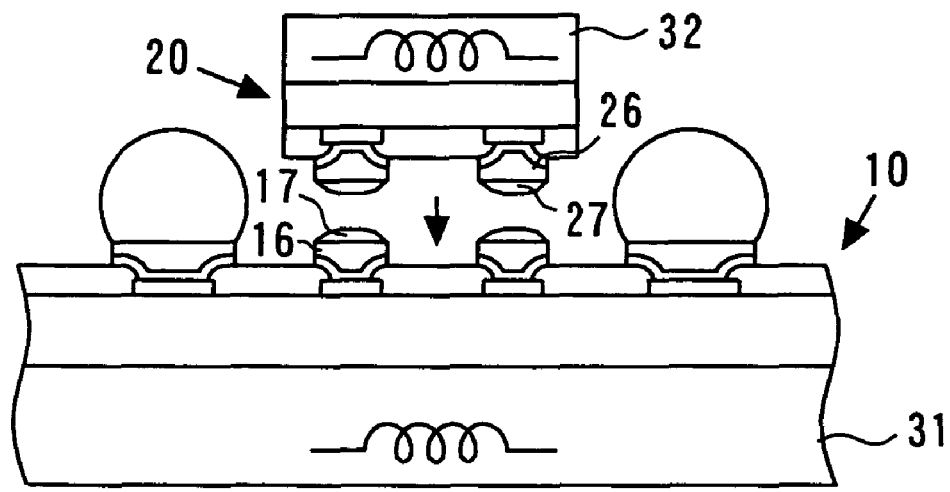
FIG. 6 is a sectional view showing a process of flip-chip-connecting the daughter chip on the circuit surface of the mother chip according to the first embodiment of the present invention.

To be specific, as shown in FIG. 6, the mother chips 10 are first placed on a stage 31 and the circuit surfaces of one of the mother chips and the daughter chip 20 are opposed to each other while holding the daughter chip 20 with a handler 32. The daughter chip 20 is then heated to a temperature higher than the melting points of the solder films 17 and 27 (the melding point of Sn—Ag solder is ordinarily 210 to 230° C.), e.g., 300° C. by using the heater mounted on the hander 32 to bond the metal posts 16 of the mother chip 10 and the metal posts 26 of the daughter chip 20 to each other by means of the solder films 17 and 27 in a thermocompression bonding manner.

The oxide film in the surface of the solder film 17 is easily broken at the time of flip-chip joining since the film thickness of the surface oxide film is limited to several nanometers in the above-described step S8, thus obtaining a good fluxless junction. Ar sputtering plasma cleaning may be performed before flip-chip connection for the purpose of removing the oxide film or elements formed on the surface of the solder film 17.

If the solder films 17 and 27 are excessively thin, failure to generate stress sufficient for breaking the surface oxide film and, hence, occurrence of junction failure may result due to variation in height of the metal posts 16 and 26 and variation in parallelism between the stage 31 and the handler 32. It is, therefore, desirable to set the film thickness of the solder films 17 and 27 to 5 μm or more.

Figure 8:
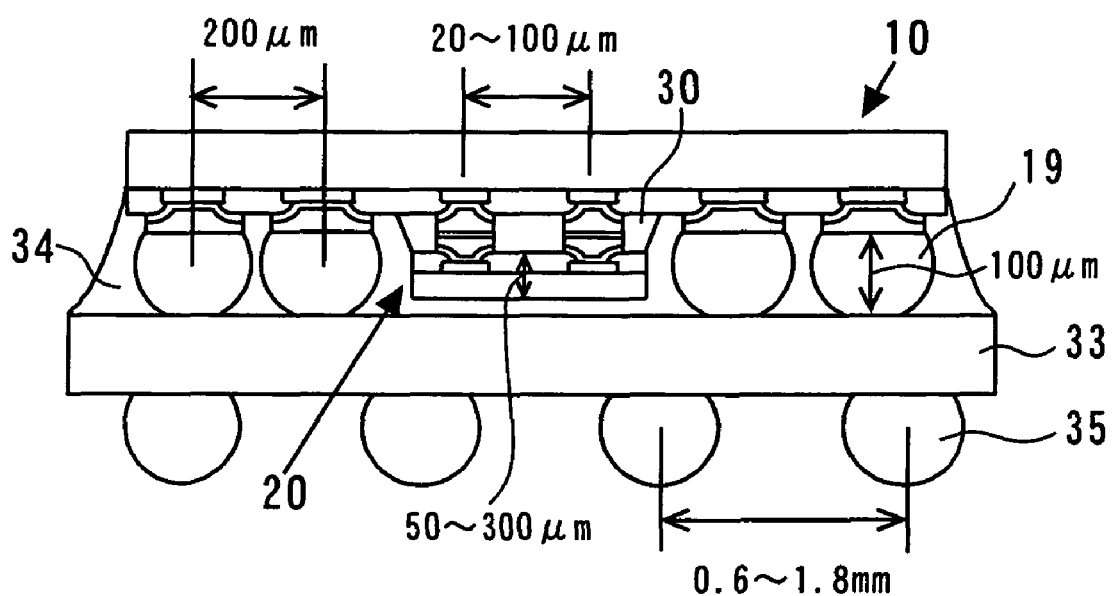
FIG. 8 is a sectional view showing a state in which the mother chip is flip-chip-connected to a circuit substrate.

At the time of this thermocompression bonding, however, the temperature of the mother chip 10 is set lower than the melting point of the solder balls 19, for example, to 100 to 150° C. by controlling a heater provided in the stage 31 in order to prevent remelting of the solder balls 19. Oxidation of the surfaces of the solder balls 19 and linkage between the solder balls 19 by remelting can be prevented in this way. Flip-chip connection is made while the daughter chip 20 is maintained at a temperature higher than the melting point of the solder films 17 and 27. However, the increase in temperature of the entire wafer surface on which the plurality of mother chips 10 are formed can be limited, because the mother chip 10 has good heat conductivity to ensure diffusion of heat, and because the heat capacity of the stage 31 on which the mother chips 10 are formed is large. It is desirable to provide a nitrogen atmosphere near the stage 31 for the purpose of preventing oxidation of the surfaces of the solder film 17 and the solder balls 19. In a structure in which chip-on-chip connection of the daughter chip 20 is made of the mother chip 10 having the solder balls 19 for flip-chip connection as in this embodiment, it is difficult to increase the distance between the circuit surface of the mother chip 10 and the circuit surface of the daughter chip 20 in construction. This is because it is preferable to form the solder balls 19 so that the solder balls 19 are higher than the back surface of the daughter chip 20. That is, if the back surface of the daughter chip 20 protrudes beyond the solder balls 19 when the mother chip is flip-chip-connected on a circuit substrate 33 as shown in FIG. 8, there is a possibility of failure to ensure the connection between the solder balls 19 and the circuit substrate 33. Also, if the distance between the back surface of the daughter chip 20 and the upper surface of the circuit substrate is extremely small in a case where the space between the back surface of the daughter chip 20 and the upper surface of the circuit substrate is filled with an underfill resin 34, a problem arises that the speed of filling with the underfill resin 34 is reduced and a reduction in productivity results or incompletion of filling occurs and a reduction in reliability of the product results. In this embodiment, therefore, the solder balls 19 are formed so as to protrude beyond the back surface of the daughter chip 20, and the daughter chip 20 and the mother chip 10 are constructed so that the distance between the circuit surface of the daughter chip 20 and the circuit surface of the mother chip 10 is 10 to 50 μm. In the case where the mother chip 10 is flip-chip-connected on the circuit substrate 33 as described above, the distance between the circuit surface of the daughter chip 20 and the circuit surface of the mother chip 10 is extremely small and, therefore, it is difficult to use a flux in the step of chip-on-chip connection between the daughter chip 20 and the mother chip 10. After solder melting connection using a flux, flux cleaning is required. However, if the distance between the circuit surface of the daughter chip 20 and the circuit surface of the mother chip 10 is extremely small, it is difficult to sufficiently clean the narrow region. If cleaning is not sufficiently performed after use of the flux, a flux residue remains on the surface to reduce the adhesion to an underfill resin 30 (described below) between the chips in the chip-on-chip construction and acts as a cause of a reduction in reliability of the semiconductor device. In this embodiment, therefore, a fluxless connection method of making connections without using any flux is used for connection between the daughter chip 20 and the mother chip 10. In a case where such a fluxless connection method is used, the effect of removing the oxide film in the surface of the solder film by a reducing flux cannot be expected and, therefore, the state of the oxide film formed in the surfaces of the solder films 17 and 27 in the preceding step seriously affects the reliability after chip-on-chip connection. For this reason, it is important to take a measure to reduce the film thickness of the oxide film formed in the surfaces of the solder films 17 and 27.

Figure 7:
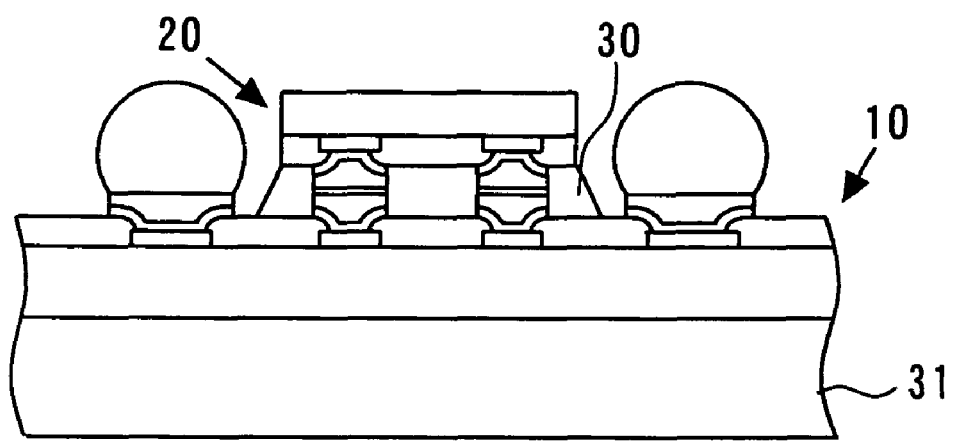
FIG. 7 is a sectional view showing a process of forming underfill resin between the chips in chip-on-chip construction.

Subsequently, as shown in FIG. 7, an underfill resin 30 is formed between the chips in the chip-on-chip construction by injecting and curing the underfill resin in the form of a paste into the space between the main surface of the mother chip 10 and the main surface of the daughter chip 20. For injection of the underfill resin 30 into the space in the chip-on-chip construction, it is preferable to set the distance between the main surface of the mother chip 10 and the main surface of the daughter chip 20 to 10 μm or more. The reason for this setting is as described below. If the distance between the main surface of the mother chip 10 and the main surface of the daughter chip 20 is smaller than 10 μm, the resistance to the flow of the underfill resin 30 is increased to increase the time required for filling, resulting in a reduction in productivity. Also, the difference between the rate of flow of the underfill resin in a small-flow-resistance region on the periphery of the daughter chip and the rate of flow of the resin in a large-flow-resistance region under the daughter chip is increased, resulting in an increase in the possibility of unfilled voids remaining between the chips. The wafer on which the plurality of mother chips 10 are formed is separated by dicing into pieces corresponding to the individual mother chips 10 (step S20). As shown in FIG. 8, each mother chip 10 is flip-chip-connected on the circuit substrate 33 by using the solder balls 19 (step S21). As the circuit substrate 33, a multilayer organic substrate, a silicon interposer, a chip or the like can be used.

Underfilling with the resin 34 is thereafter performed by injecting the resin 34 into the space between the mother chip 10 and the circuit substrate 33 (step S22). Also, outer balls 35 for external connection are formed on a lower surface of the circuit substrate 33.

The daughter chip 20 is flip-chip-connected on the circuit surface of the mother chip 10 by the above-described process, thus manufacturing the semiconductor device having the mother chip 10 flip-chip-connected on the circuit substrate. In this semiconductor device, the pitch between the solder balls 19 (the distance between centers of the solder balls 19) is 200 μm; the pitch between the metal posts 16 (or the metal posts 26) (the distance between centers of the metal posts 16) is 20 to 100 μm; the thickness of the daughter chip 20 is 30 to 50 μm; the distance between the daughter chip 20 and the mother chip 10 is 10 to 50 μm; the diameter of the solder balls is 120 μm; the height of the solder balls is 80 μm; and the pitch between the outer balls 35 (the distance between centers of the outer balls 35) is 0.6 to 1.8 mm.

Figure 9:
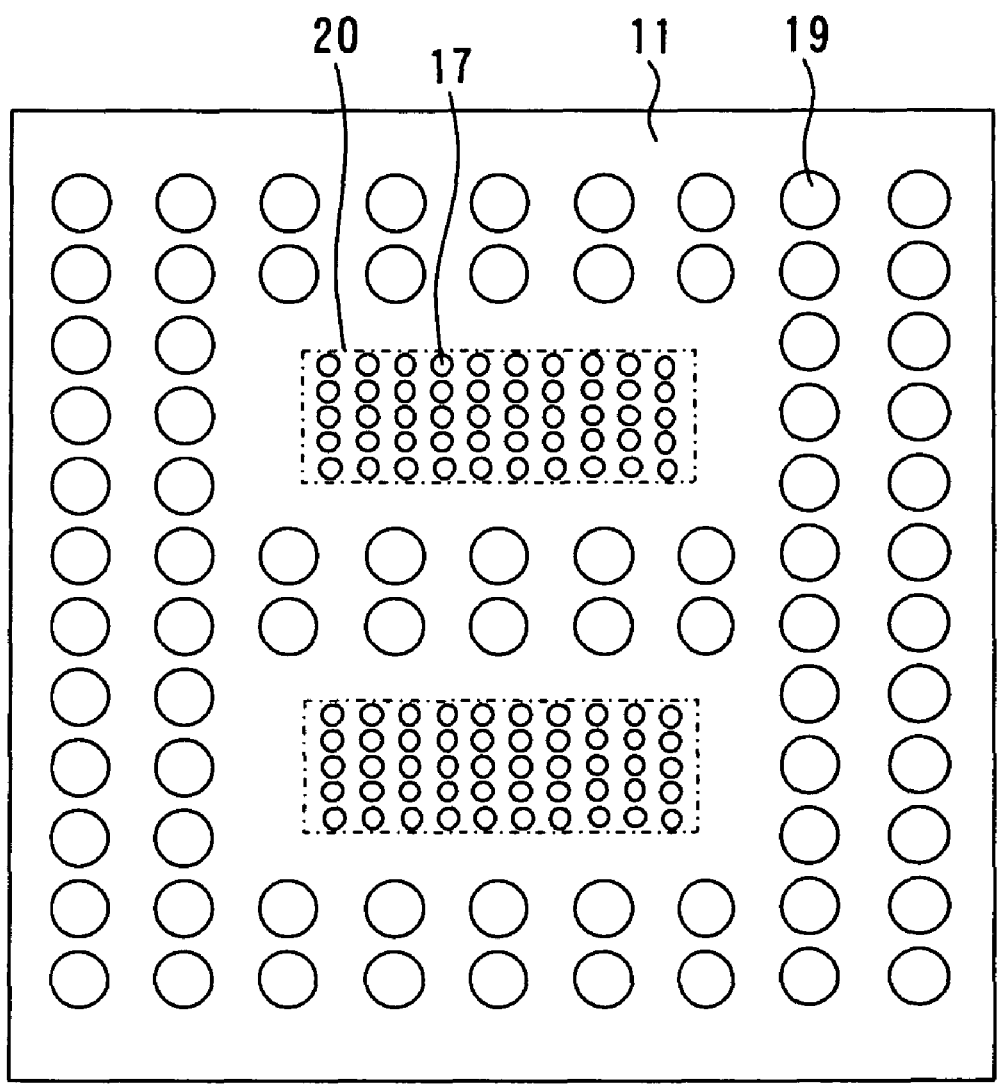
FIG. 9 is a top view of the circuit surface of the mother chip.

FIG. 9 is a top view of the mother chip showing the circuit surface. As illustrated, the solder balls 19 are disposed so as to surround the daughter chip 20 to ensure the provision of the desired number of ground and power supply bumps for the wiring substrate and the mother chip, dispersion of stress to the solder balls, the provision of paths for heat release to the wiring substrate, and so on.

In the method of manufacturing the semiconductor device according to this embodiment, reflowing for forming solder balls is performed in a nitrogen atmosphere in which the oxygen concentration is 500 ppm or less. The film thickness of the oxide film in the surface of the solder film is limited to several nanometers in this way to prevent the occurrence of failure of contact between the mother chip and the daughter chip.

Second Embodiment

In a second embodiment of the present invention, reflowing for forming solder balls in a nitrogen atmosphere as in the first embodiment is not performed but the oxide film formed in the surface of the solder film is removed by hydrogen plasma after the formation of solder balls. That is, after the solder ball 19 reflowing step, the oxide film formed in the surface of the solder film 17 is removed or the oxide film thickness is reduced to a value small enough to avoid the problem (several nanometers or less). Joining in the subsequent chip-on-chip connection step can be improved in this way. As a means for removing or reducing the oxide film as described above, exposure of the oxide film to a hydrogen plasma atmosphere, i.e., a reducing plasma, is conceivable. By the reducing action of hydrogen radicals generated in the hydrogen plasma, the oxide film can be effectively removed or reduced. The other steps are the same as those in the first embodiment. The same effect as that in the first embodiment is achieved in this way.

Third Embodiment

In a third embodiment of the present invention, reflowing for forming solder balls in a nitrogen atmosphere as in the first embodiment is not performed, but, after the solder ball 19 reflow step, a reducing flux is applied to the entire surface of the mother chip 10 wafer and a heat treatment is performed thereon. The oxide film can be removed or reduced by the reducing action of the flux. That is, after the solder ball 19 reflowing step, the oxide film formed in the surface of the solder film 17 is removed or the oxide film thickness is reduced to a value small enough to avoid the problem (several nanometers or less). Joining in the subsequent chip-on-chip connection step can be improved in this way. The other steps are the same as those in the first embodiment. The same effect as that in the first embodiment is achieved in this way.

Fourth Embodiment

Figure 10:
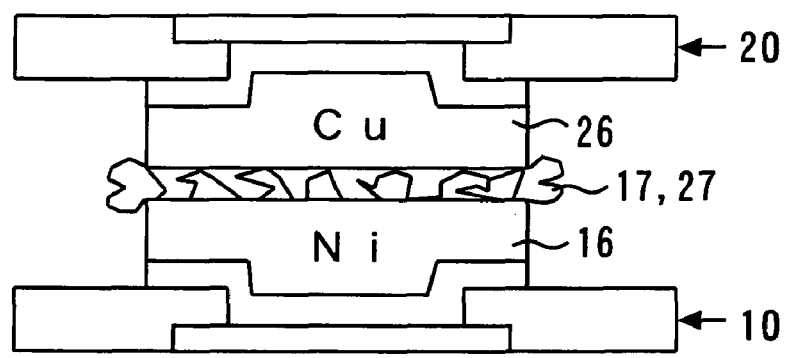
FIG. 10 is a sectional view of a junction between metal posts according to a fourth embodiment of the present invention.

In a fourth embodiment of the present invention, as shown in FIG. 10, Ni is used as the material of the metal posts 16 of the mother chip 10, while Cu is used as the material of the metal posts 26 of the daughter chip 20. In other respects, the arrangement is the same as those in the first to third embodiments.

The amount of growth of a NiSn alloy with the solder film 17 having Sn as a main component is small, about 1 μm. Therefore, the film thickness of metal posts 16 can be easily controlled. Also, Ni can act as a barrier against diffusion from solder balls 19 with high-temperature reliability even if its thickness is small. Cu can also be used as the material of the metal posts 16 of the mother chip 10. In this case, however, there is a need to set the film thickness by considering the growth of a SnCu alloy.

The rate of growth of a SnCu alloy is comparatively high. Therefore, alloy bridges can be formed even if the spacing between the metal posts 16 and the metal posts 26 is not reduced. The solidified SnCu alloy has an increased melting point and is, therefore, capable of preventing short-circuit between bumps in the subsequent process. Further, the metal posts can be formed higher when Cu is used than when Ni having a high plating film pressure is used. Therefore, the gap between the daughter chip and the mother chip can be increased to improve the facility with which underfilling between the two chips is performed. If remelting is performed in order to improve the adhesion of the solder film 17, there is a need to set the film thickness of the solder film 17 so that the metal necessary for joining remains by considering the film thickness of the SnCu alloy, about 2 to 5 μm for example. COC mounting may be performed without remelting.

Figure 11A:
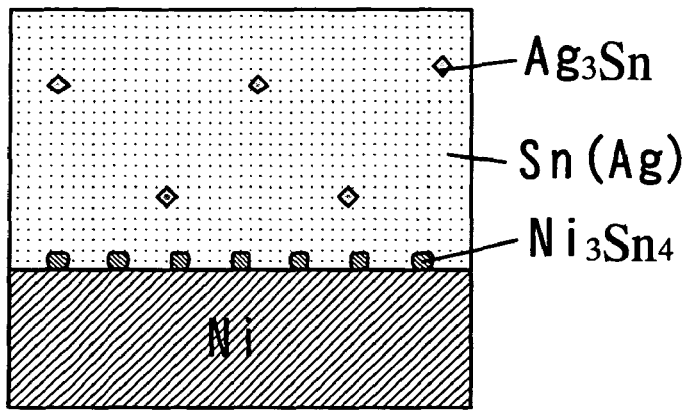
FIGS. 11A to 11C are sectional views of a Ni post and Sn (Ag) film near the interface therebetween.
Figure 11B:
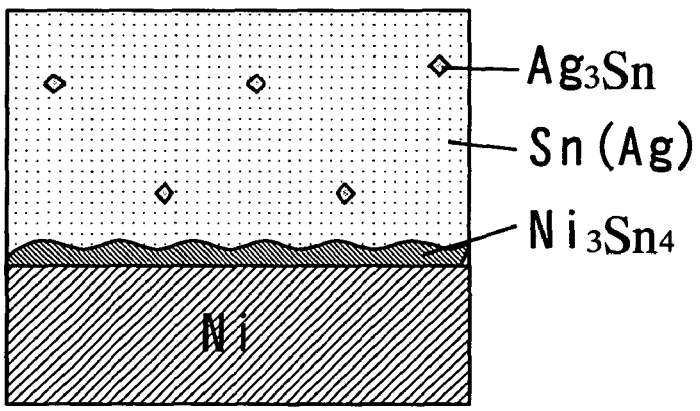
Figure 11C:
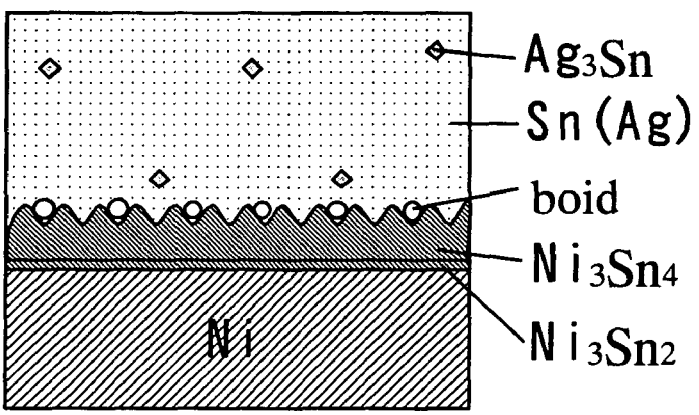

Detailed description will further be made of the alloy formation at the interface between the metal posts and the solder film or at the interface between the metal posts. FIGS. 11A to 11C are sectional views of the Ni post and Sn (Ag) film near the interface in initial, middle and late stages. A NiSn alloy is formed in stratum on the interface. The rate of formation of the NiSn alloy is comparatively low. The sum of the volumes of Sn and Ni is larger than the volume of a $Ni_3Sn_4$ alloy. Minuscule voids are formed by volume contraction on the Sn film side of the interface between the $Ni_3Sn_4$ alloy and the Sn film.

Figure 12A:
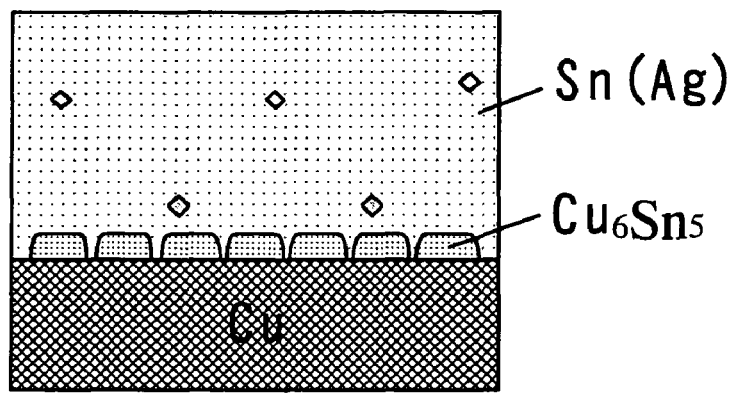
FIGS. 12A to 12C are sectional views of a Cu post and Sn (Ag) film near the interface therebetween.
Figure 12B:
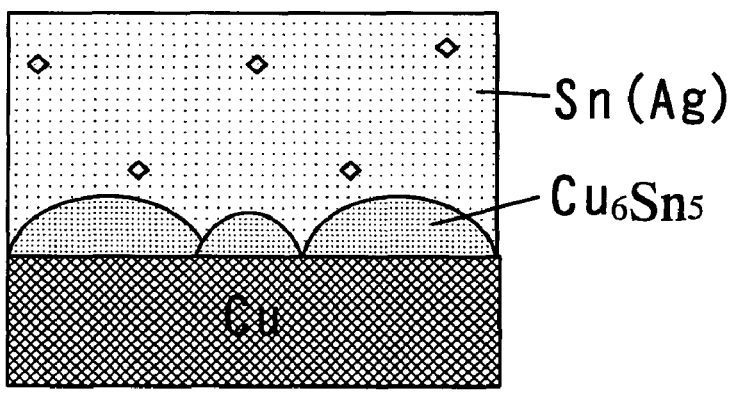
Figure 12C:
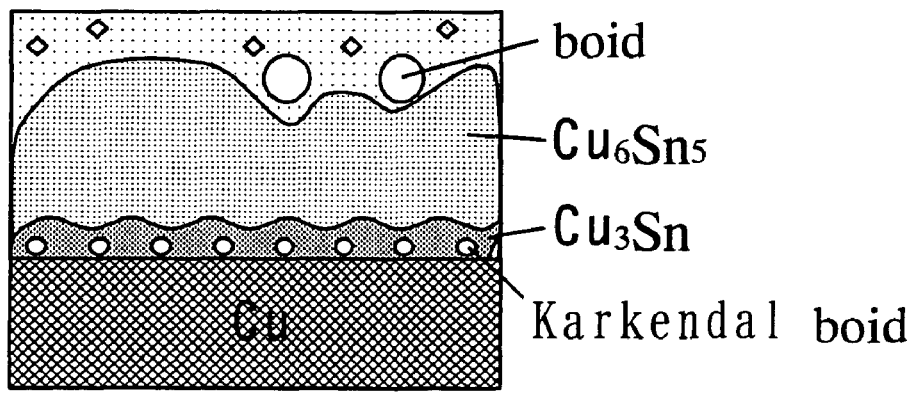

FIGS. 12A to 12C are sectional views of the Cu post and Sn (Ag) film near the interface in initial, middle and late stages. A $Cu_6Sn_5$ alloy is formed in stratum on the interface by being grown at a varying rate. The rate of formation of the $Cu_6Sn_5$ alloy is comparatively high. The sum of the volumes of Sn and Cu is larger than the volume of the $Cu_6Sn_5$ alloy. Voids are formed on the Sn film side of the interface between the $Cu_6Sn_5$ alloy and the Sn film. These voids become comparatively large because rate of formation of the $Cu_6Sn_5$ alloy is high. The rate of mutual diffusion of Cu is higher than that of Sn. Therefore, Karkendal voids are formed in the CuSn alloy.

Figure 13A:
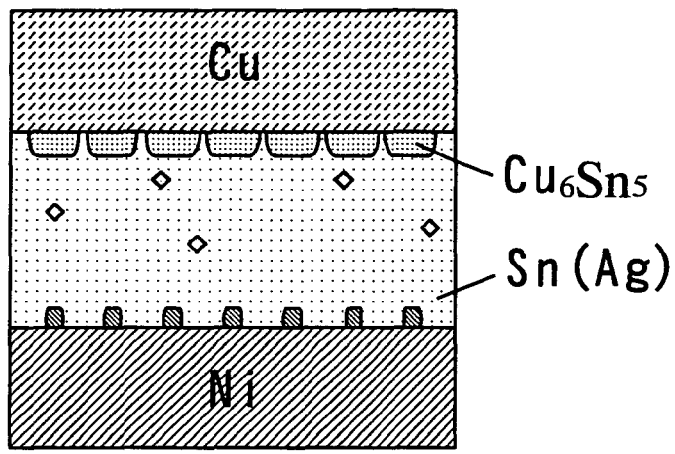
FIGS. 13A to 13C are sectional views of a Cu post and a Ni post near a junction therebetween (in a case where the distance between the posts is large)
Figure 13B:
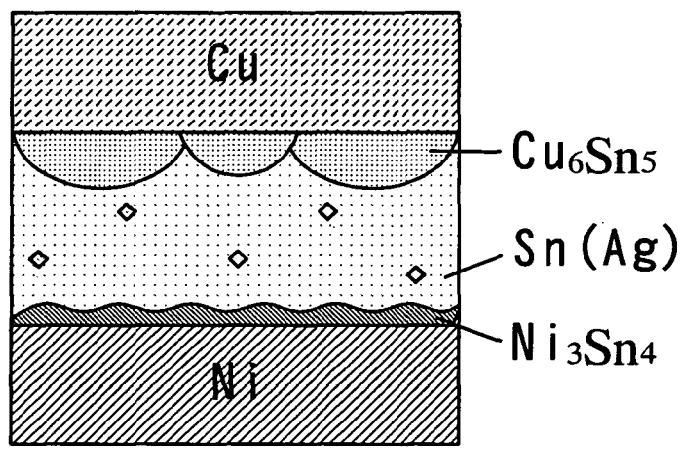
Figure 13C:
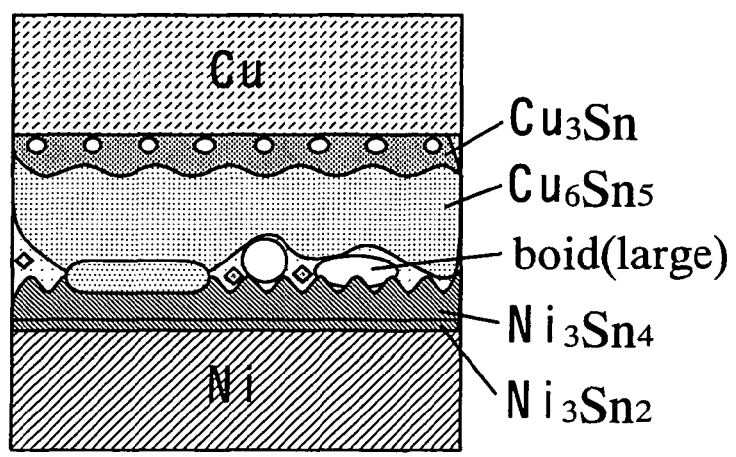

FIGS. 13A to 13C are sectional views of the Cu post and the Ni post Sn near the junction therebetween in initial, middle and late stages (in a case where the distance between the posts is sufficiently large). When the distance between the posts is sufficiently large, a small amount of Sn (Ag) remains in stratum, and minuscule voids formed on the Sn side collect together to form large voids.

Figure 14A:
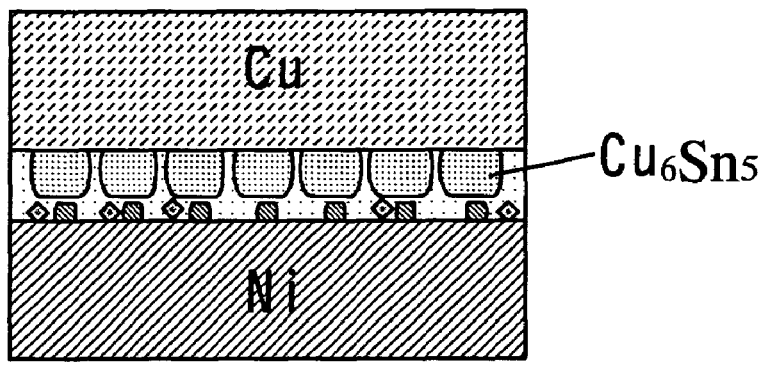
FIGS. 14A to 14C are sectional views of a Cu post and a Ni post near a junction therebetween (in a case where the distance between the posts is small)
Figure 14B:
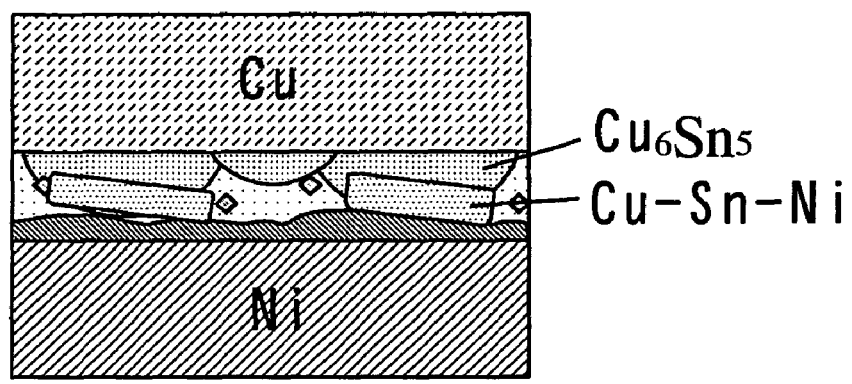
Figure 14C:
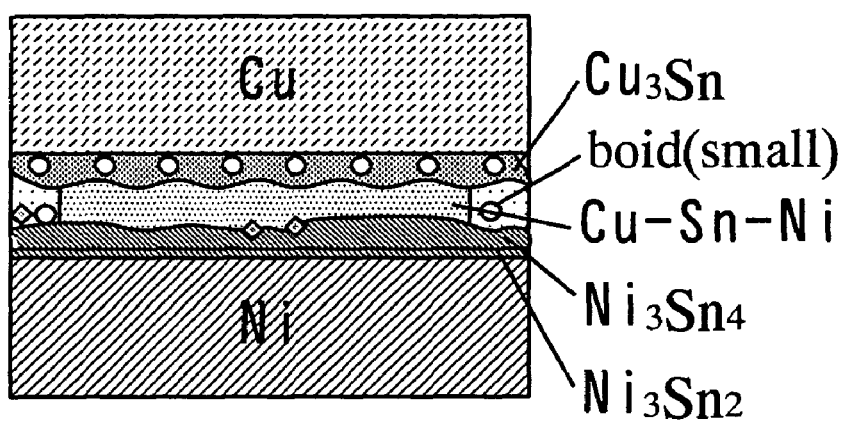

FIGS. 14A to 14C are sectional views of the Cu post and the Ni post Sn near the junction therebetween in initial, middle and late stages (in a case where the distance between the posts is small). Since the rate of formation of the CuSn alloy is high, Sn (Ag) layer can hardly remain and a large void cannot be easily formed.

Fifth Embodiment

Figure 15:
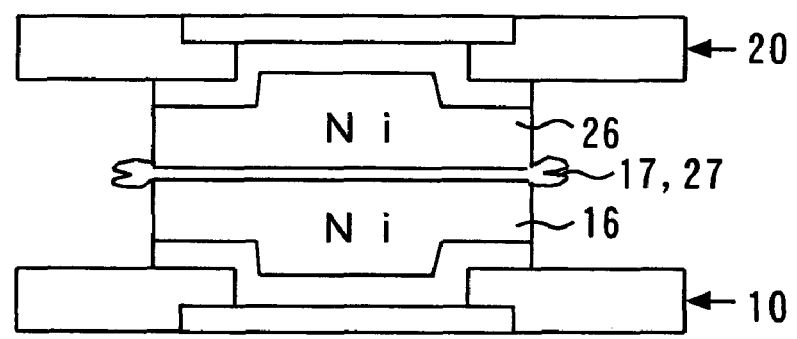
FIG. 15 is a sectional view of a junction between metal posts according to a fifth embodiment of the present invention.

In a fifth embodiment of the present invention, as shown in FIG. 15, Ni is used as the material of the metal posts 16 of the mother chip 10 and as the material of the metal posts 26 of the daughter chip 20. Solder film 17 is formed on the metal posts 16, while solder film 27 is formed on the metal posts 26. In other respects, the arrangement is the same as those in the first to third embodiments.

However, since the rate of growth of the SnNi alloy is low, $Ni_3Sn_4$ alloy bridges are not sufficiently formed between the metal posts if the thickness of the Sn film interposed between the Ni films is large. Therefore, there is a problem that the Sn layer remains in film form and diffusion voids are successively formed in film form along the interface between the Sn layer and the $Ni_3Sn_4$ alloy layer to cause a reduction in junction fatigue resistance.

The distance between the metal posts 16 of the mother chip 10 and the metal posts 26 of the daughter chip 20 is then reduced to 5 μm or less, thereby ensuring that $Ni_3Sn_4$ alloy bridges can be formed with reliability. As a result of the formation of $Ni_3Sn_4$ alloy bridges, the Sn layer has a partially divided structure; diffusion voids are generated in the vicinity of an interface in the Sn layer; the amount of voids is small even if the mechanical strength of the Sn layer interface portion is reduced; and the formation of $Ni_3Sn_4$ alloy bridges of a comparatively high mechanical strength ensures that the reduction in the strength of the junction between the mother chip 10 and the daughter chip 20 can be limited, thus improving the reliability of the product.

In a case where NiSn alloy bridging between the metal posts is not performed, reworking can be performed since the melting point of the junction is not increased. If necessary, alloy bridges may be formed by wafer-basis batch thermocompression bonding after a chip operation check after COC mounting to enable nondefective mother chips to be effectively used.

Figure 16A:
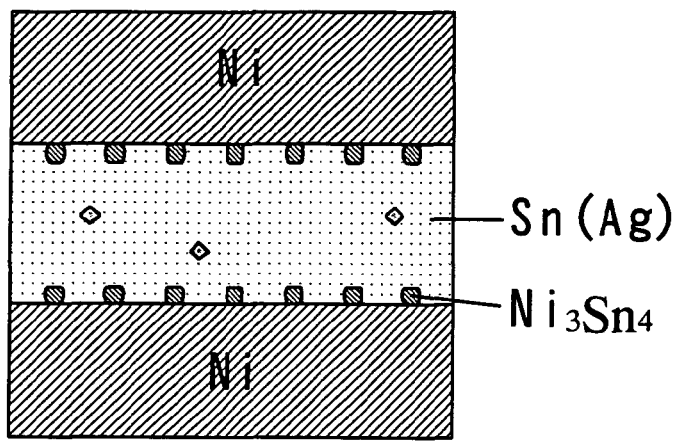
FIGS. 16A to 16C are sectional views of Ni posts near a junction therebetween (in a case where the distance between the posts is large)
Figure 16B:
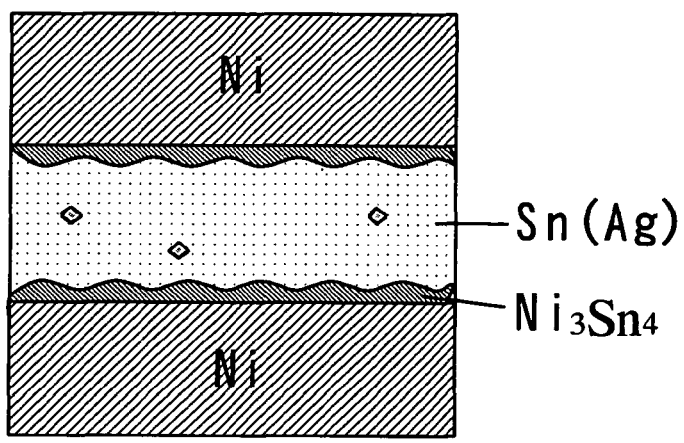
Figure 16C:
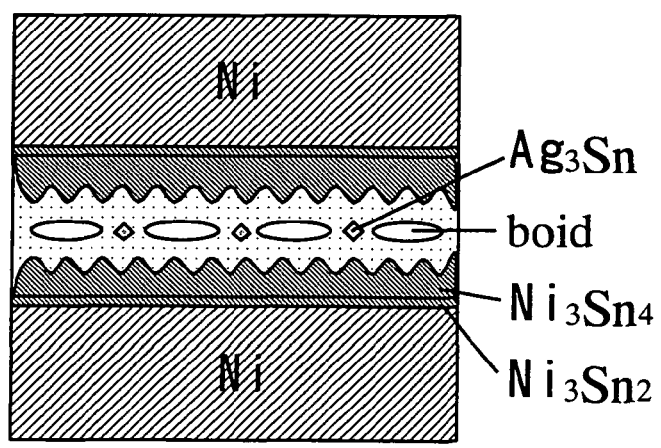

Detailed description will further be made of the alloy formation at the interface between the metal posts. FIGS. 16A to 16C are sectional views of the Ni posts near the junction in initial, middle and late stages (in a case where the distance between the posts is large). When the distance between the posts is sufficiently large, a small amount of Sn (Ag) remains in stratum, and minuscule voids formed on the Sn side collect together to form large voids along the junction interface.

Figure 17A:
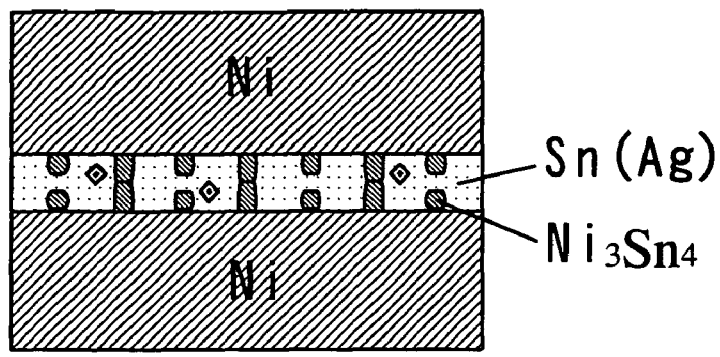
FIGS. 17A to 17C are sectional views of Ni posts near a junction therebetween (in a case where the distance between the posts is small)
Figure 17B:
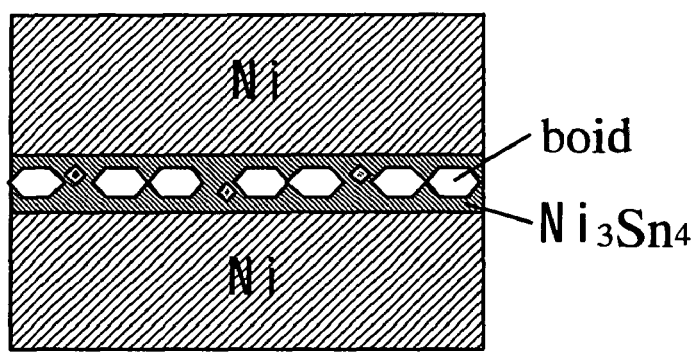
Figure 17C:
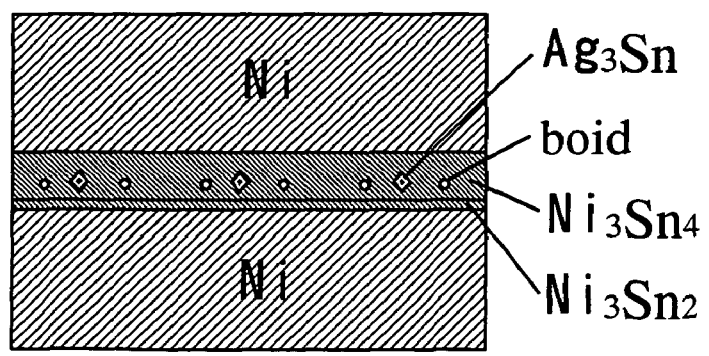

FIGS. 17A to 17C are sectional views of the Ni posts near the junction in initial, middle and late stages (in a case where the distance between the posts is small). Sn (Ag) does not remain stratum and the $Ni_3Sn_4$ alloy is grown so as to be partially divided. Therefore, only minuscule voids exist scatteringly and no large voids are formed. As a result, the junction strength is increased.

Sixth Embodiment

In a sixth embodiment of the present invention, metal posts differing in lateral width are used as the metal posts 16 of the mother chip 10 and the metal posts 26 of the daughter chip 20. In other respects, the arrangement is the same as those in the first to fifth embodiments.

Figure 18:
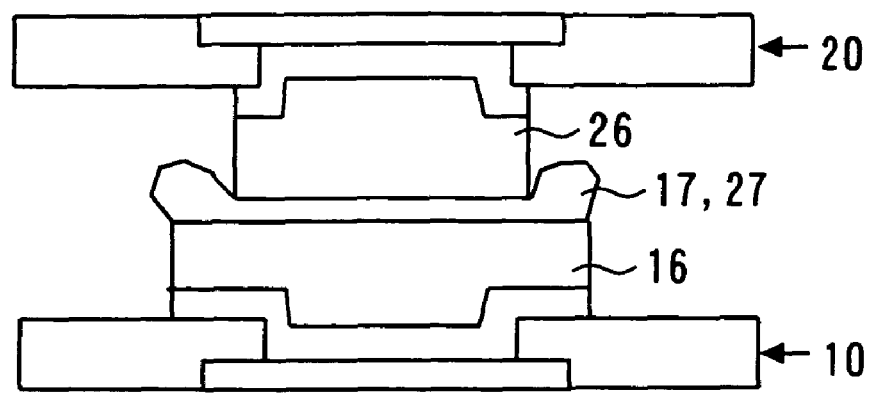
FIG. 18 is a sectional view of a junction between metal posts according to a sixth embodiment of the present invention.
Figure 19:
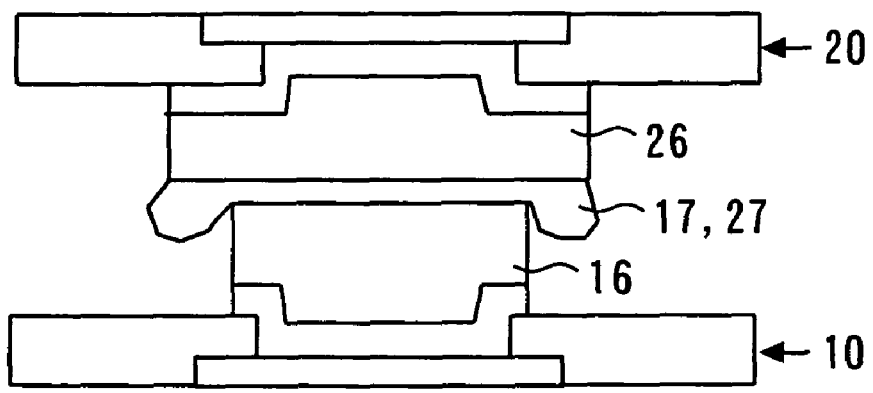
FIG. 19 is a sectional view of a junction between metal posts according to the sixth embodiment of the present invention.

FIG. 18 shows a case where the lateral width of the metal posts 16 of the mother chip 10 is larger than that of the metal posts 26 of the daughter chip 20, and FIG. 19 shows a case where the lateral width of the metal posts 16 of the mother chip 10 is smaller than that of the metal posts 26 of the daughter chip 20. This arrangement provides a space for receiving the materials of the solder films 17 and 27 flowing out from the position between each pair of metal post 16 and metal post 26 by the pressure applied at the time of joining. Protrusion of the solder film 27 from the position between each pair of metal posts is thereby limited to prevent leakage to other metal posts or other portions.

Seventh Embodiment

Figure 20:
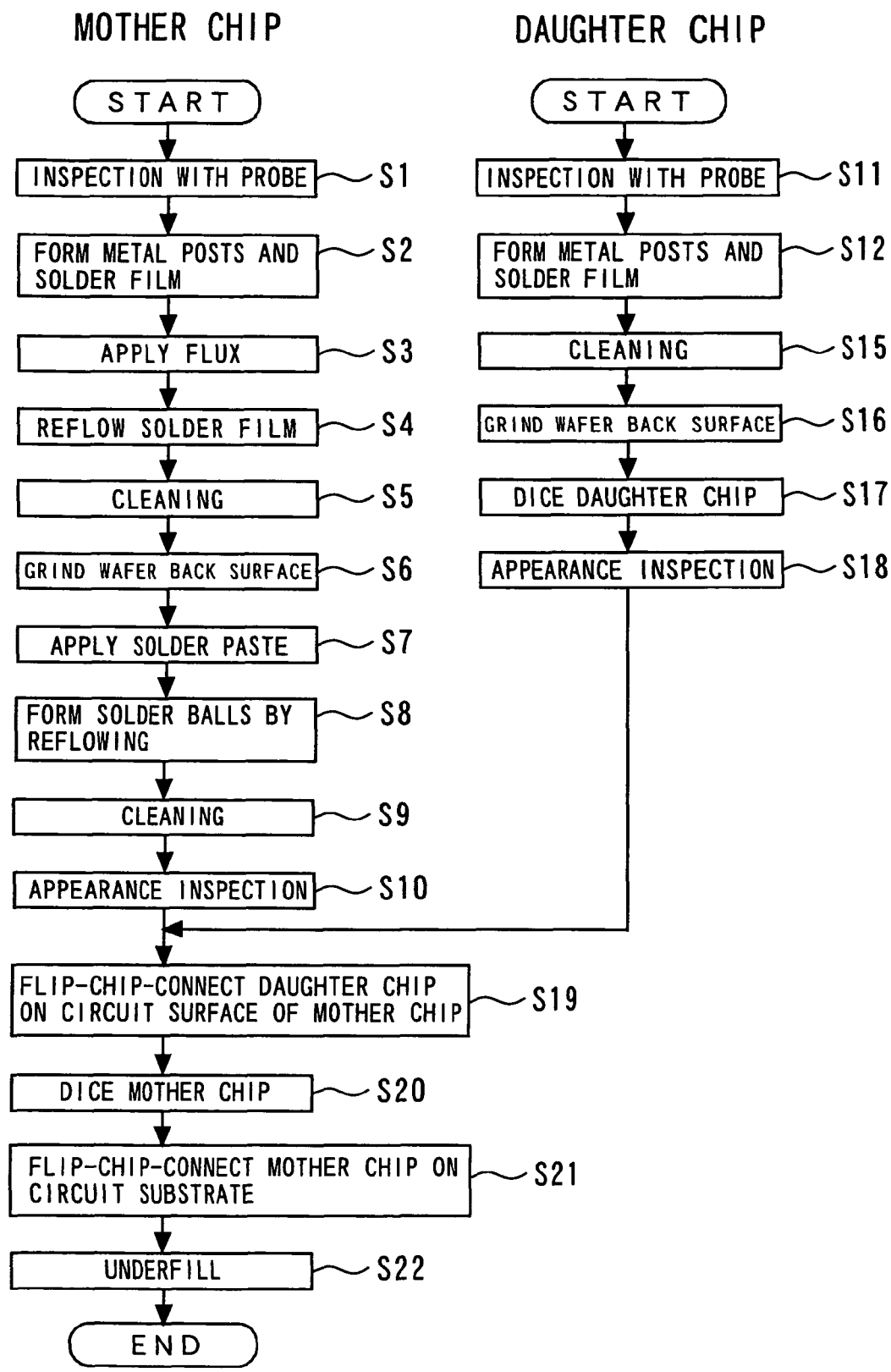
FIG. 20 is a flowchart showing a semiconductor device manufacturing method according to a seventh embodiment of the present invention.

A method of manufacturing a semiconductor device according to a seventh embodiment of the present invention will be described with reference to the flowchart of FIG. 20 and other figures.

The same process as that represented by steps S1 to S10 in the first embodiment is performed to form a mother chip 10.

Figure 21A:
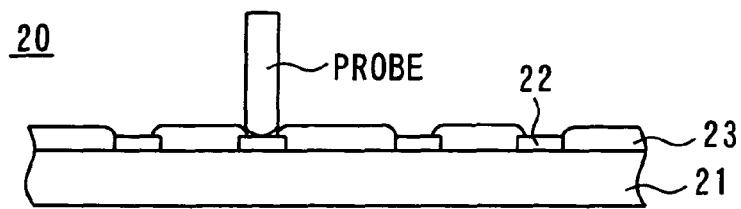
FIGS. 21A to 21F are sectional views showing a process of forming a daughter chip according to the seventh embodiment of the present invention.

A process of forming a daughter chip 20 will next be described. As shown in FIG. 21A, Al electrodes 22 are first formed on a substrate 21 (circuit surface) and other regions are covered with surface protective film 23. An inspection is made by applying a probe to the Al electrodes 22 (step S11). This inspection is made on each of a plurality of daughter chips 20 formed on the wafer, and a wafer map indicating the nondefective/defective state of each daughter chip 20 on the wafer is made.

Figure 21B:
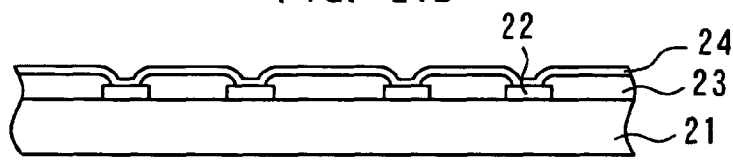
Figure 21C:
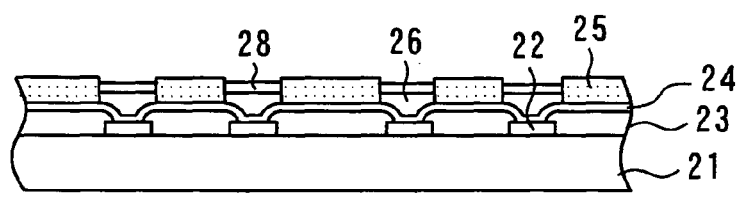

Subsequently, as shown in FIG. 21B, barrier metal 24 in multilayer form comprising Ti, Cu, Ni, Cr and W for example is formed on the entire surface by a sputtering technique or a plating technique for example. The total thickness of the barrier metal 24 in this embodiment is 1 μm or less. As shown in FIG. 21C, a resist 25 having openings corresponding to regions where the Al electrodes 22 exist is formed, and metal posts 26 are formed by filling the openings in the resist 25 with Ni film by an electrolytic plating technique using the barrier metal 24 as a feeder film. Activation processing is performed on the surfaces of the metal posts 26 and Au film 28 is formed on the metal posts 26 by nonelectrolytic plating for example (step S12'). Au film 28 may be formed by an electrolytic plating technique using the barrier metal 24 as a feeder film instead of the nonelectrolytic plating. Also, the metal posts 26 may be formed of Au.

Figure 21D:
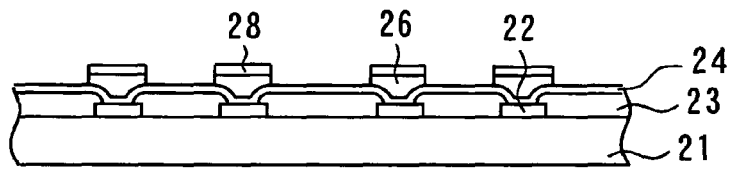

Thereafter, the resist 25 is removed and cleaning is performed, as shown in FIG. 21D (step S15). The thickness of the metal posts 26 is about 10 to 50 μm if the material is Cu, and is about 1 to 5 μm if the material is Ni. The pitch between the metal posts 26 is 20 to 100 μm. The thickness of the Au film 28 is about 0.1 μm. If the metal posts 26 are unnecessary, the Au film 28 may be formed on the barrier metal 24 without forming the metal posts 26.

Figure 21E:
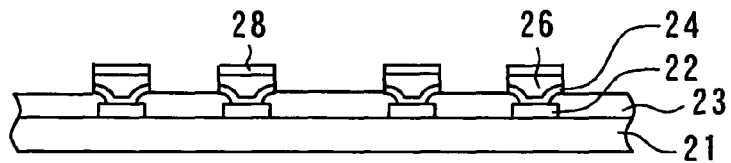
Figure 22:
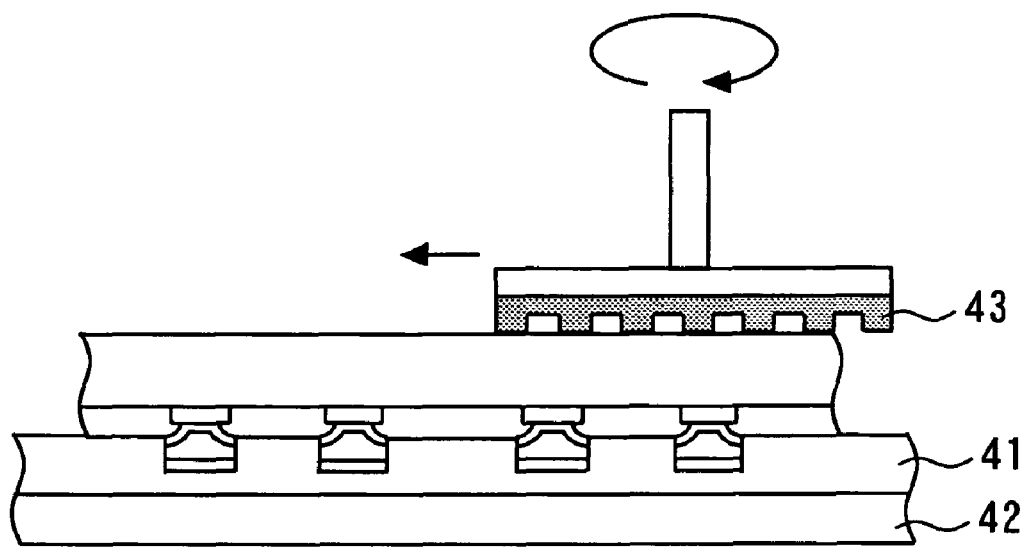
FIG. 22 is a sectional view showing a wafer back surface grinding step.
Figure 23:
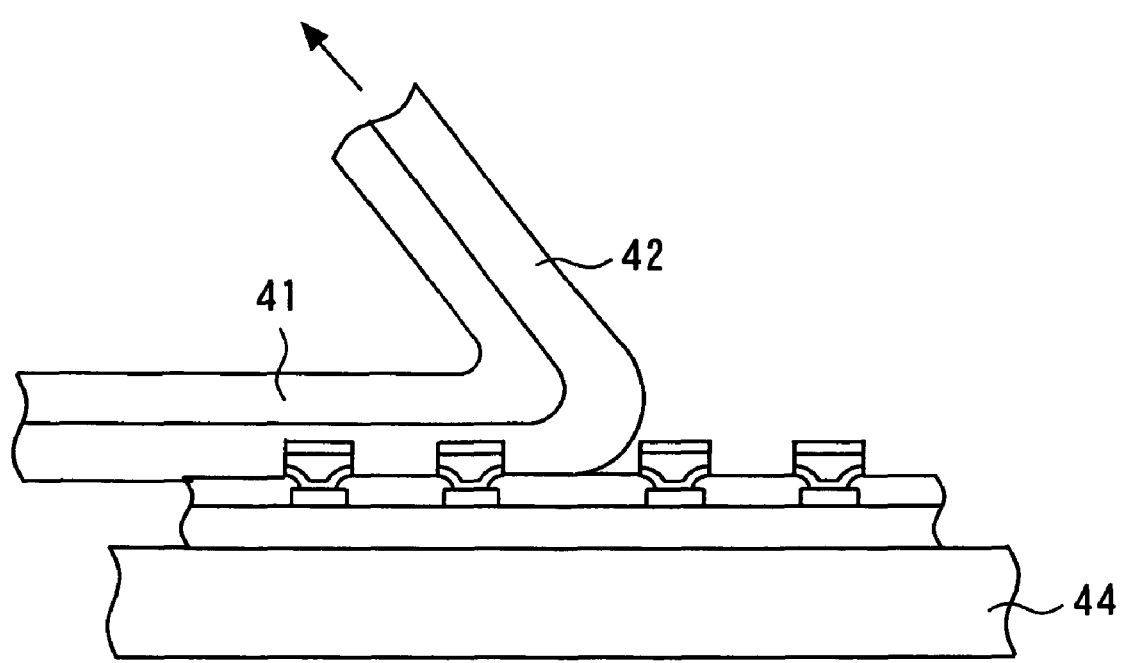
FIG. 23 is a sectional view showing a state in which a dicing tape is attached to the wafer back surface and a back grinding tape on the wafer main surface is removed.

Subsequently, as shown in FIG. 21E, the barrier metal 24 is etched by anisotropic etching, with the metal posts 26 used as a mask. Wafer back surface grinding is performed until the wafer thickness is reduced to a predetermined value of, for example, 30 to 50 μm (step S16). In the wafer back surface grinding step, as shown in FIG. 22, the back surface of the wafer is ground with a grinding wheel 43 while a back grinding tape 42 having an adhesive layer on its surface is attached to the wafer main surface to protect the wafer main surface. The wafer back surface grinding step is not limited to the mechanical grinding with the grinding wheel 43, as in the first embodiment. A chemical means using an etching solution may be used as desired for the wafer back surface grinding step. After the completion of wafer back surface grinding, as shown in FIG. 23, a dicing tape 44 is attached to the wafer back surface and the back grounding tape 42 on the wafer main surface is removed, thereby enabling the next dicing step. If the height of the projecting electrodes on the wafer main surface corresponding to the sum of the thicknesses of the barrier metal 24, the metal posts 26 and the Au film 28 projecting on the wafer main surface is excessively large, the projecting electrodes bite into the adhesive layer of the back grinding tape 42 to increase the adhesion with the back grinding tape 42 and there is a possibility of occurrence of a problem that the wafer is broken at the time of separation of the back grinding tape 42. This problem is particularly serious in a case where the wafer is made extremely thin by wafer back surface grinding to largely reduce the rigidity of the wafer. Therefore, in a case where the thickness of the wafer is reduce to 100 μm or less by wafer back surface grinding while the back grinding tape 42 is attached to the wafer main surface, it is preferred that the height of the electrodes projecting on the wafer main surface, i.e., the sum of the thicknesses of the barrier metal 24, the Ni metal posts 26 and the Au film 28 in this embodiment, be set to 15 μm or less to prevent the wafer from being damaged in the subsequence back grinding tape 42 separation step. In this embodiment, the thickness on the mother chip 10 side after wafer back surface grinding is 200 to 600 μm. Therefore, it is comparatively easy to ensure the desired rigidity of the mother chip 10 wafer. Then the height of the projecting electrodes corresponding to the sum of the thicknesses of the barrier metal 14, the Ni metal posts 16 and the solder film 17 on the mother chip 10 side is larger than the height of the projecting electrodes corresponding to the sum of the thicknesses of the barrier metal 24, the Ni metal posts 26 and the Au film 28 on the daughter chip 20 side, thereby ensuring the sufficient distance between the main surfaces of the mother chip 10 and the daughter chip 20 after the metal post joining even in a case where the height of the projecting electrodes on the daughter chip 20 side is reduced. Forming only on the mother chip 10 side the solder film functioning as a junction material between the metal posts is also effective in reducing the height of the projecting electrodes on the daughter chip 20 side. Preferably, the projecting electrodes on the mother chip 10 side are also formed so as to have a height of 15 μm or less, whereby application of excessive stress in the back grinding tape separation step after the wafer back surface grinding step using the back grinding tape 42 may be avoided. In this embodiment, the thickness of the Ni metal posts 16 on the mother chip 10 side is 5 μm; the thickness of the solder film 17 on the mother chip 10 side is 5 μm; the thickness of the Ni metal posts 27 on the daughter chip 20 side is 1 to 5 μm; the thickness of the Au film 28 on the daughter chip 20 side is 0.1 μm; and the thickness of the barrier metal of each chip is 1 μm or less.

Figure 21F:
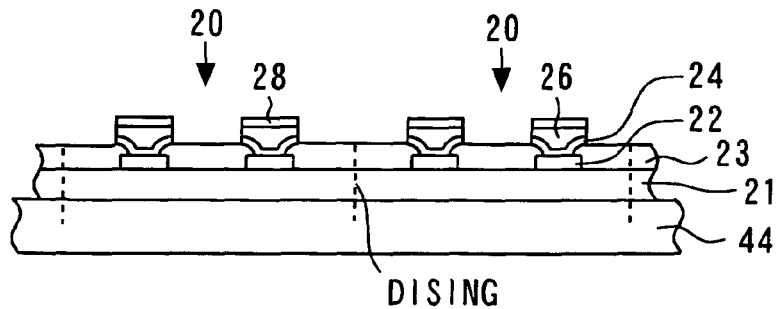

Subsequently, as shown in FIG. 21F, the plurality of daughter chips 20 formed on the wafer are individually separated by dicing (step S17). An appearance inspection is thereafter performed (step S18). The daughter chip 20 is formed by the above-described process. An active element such as a memory may be used as the daughter chip 20, and a combination of an active element and a passive element such as a chip capacitor may be mounted as the daughter chip 20. In this embodiment, the mother chip 10 is a logic circuit chip having a central processing unit (CPU) which processes a signal externally supplied, while the daughter chip 20 is a memory chip on which a dynamic random access memory (DRAM) functioning as a cache memory which caches a running program and data during CPU operation is mounted. The present invention is applied not only to these system configurations. However, high-speed highly-reliable data transmission and reception can be realized by making chip-on-chip connection between the mother chip 10 having a high-speed logic circuit in particular and the daughter chip 20 having a high-speed RAM circuit provided as a cache memory and by making flip-chip connection between the mother chip 10 and the circuit substrate 33.

A process of flip-chip-connecting the daughter chip on the circuit surface of the mother chip will next be described. The daughter chip 20 recognized as a nondefective through the brobe test in step S11 and the appearance inspection in step S18 is flip-chip-connected on the circuit surface of each of the mother chips 10 recognized as a nondefective through the brobe test in step S1 and the appearance inspection in step S6 (step S19).

Figure 24:
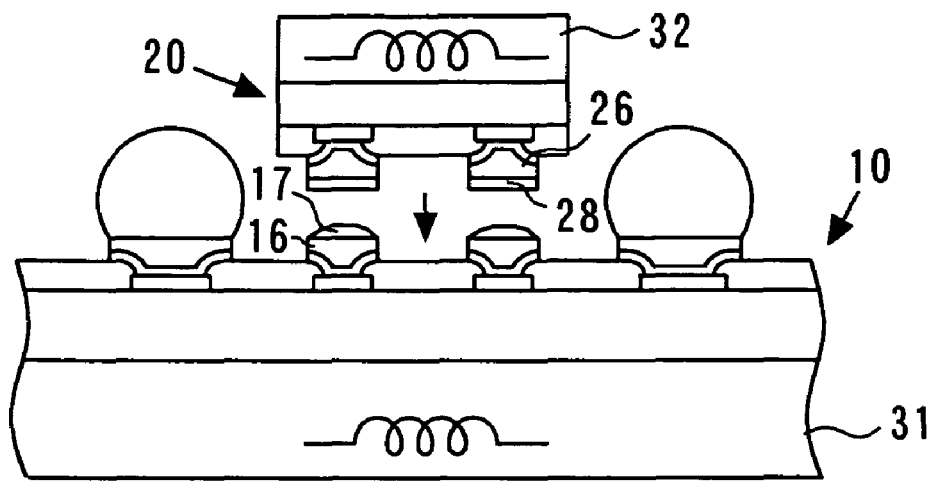
FIG. 24 is a sectional view showing a step of flip-chip-connecting the daughter chip on the circuit surface of the mother chip according to the seventh embodiment of the present invention.

To be specific, as shown in FIG. 24, the mother chips 10 are first placed on a stage 31 and the circuit surfaces of one of the mother chips and the daughter chip 20 are opposed to each other while holding the daughter chip 20 with a handler 32. The daughter chip 20 is then heated to a temperature higher than the melting point of the solder film 17 (the melding point of Sn—Ag solder is ordinarily 210 to 230° C.), e.g., 300° C. by using the heater provided on the handler 32 to bond the metal posts 16 of the mother chip 10 and the metal posts 26 of the daughter chip 20 to each other by means of the solder film 17 in a thermocompression bonding manner. A semiconductor device is manufactured by thereafter performing the same process steps as steps S20 to S22 in the first embodiment.

If the solder film 17 is excessively thin, failure to generate stress sufficient for breaking the surface oxide film and, hence, occurrence of junction failure may result due to variation in height of the metal posts 16 and 26 and variation in parallelism between the stage 31 and the handler 32. It is, therefore, desirable to set the film thickness of the solder film 17 to 5 μm or more.

At the time of this thermocompression bonding, however, the temperature of the mother chip 10 is set lower than the melting point of the solder balls 19, for example, to 100 to 150° C. by controlling a heater provided in the stage 31 in order to prevent remelting of the solder balls 19. Oxidation of the surfaces of the solder balls 19 and linkage between the solder balls 19 by remelting can be prevented in this way. Flip-chip connection is made while the daughter chip 20 is maintained at a temperature higher than the melting point of the solder film 17. However, the increase in temperature of the wafer on which the plurality of mother chips 10 are formed can be limited, because the wafer has good heat conductivity to ensure diffusion of heat, and because the heat capacity of the stage 31 on which the mother chip 10 is formed is large. It is desirable to provide a nitrogen atmosphere near the stage 31 for the purpose of preventing oxidation of the surfaces of the solder film 17 and the solder balls 19.

In this embodiment, as described above, the Au film 28 on which substantially no oxide film is formed is formed on the metal posts 26 of the daughter chip 20, thereby enabling the total thickness of the oxide film in the junction between the metal posts to be reduced. As a result, the oxide film can be broken with reliability at the time of flip-chip connection. Also, the amount of protrusion of the solder film from the position between the metal posts can be reduced.

Figure 25:
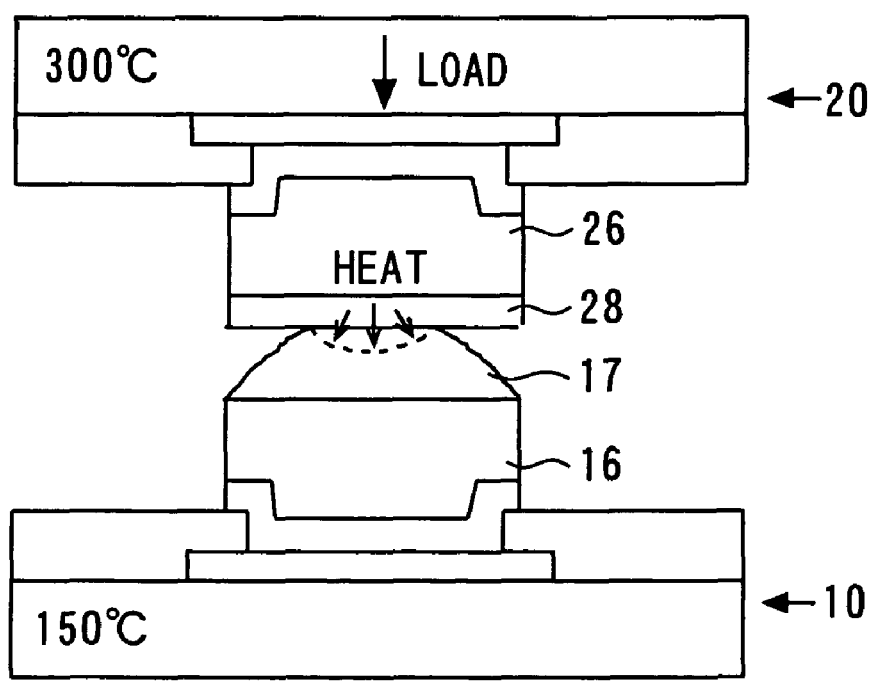
FIG. 25 is an enlarged sectional view of a junction between the metal posts shown in FIG. 24.
Figure 26:
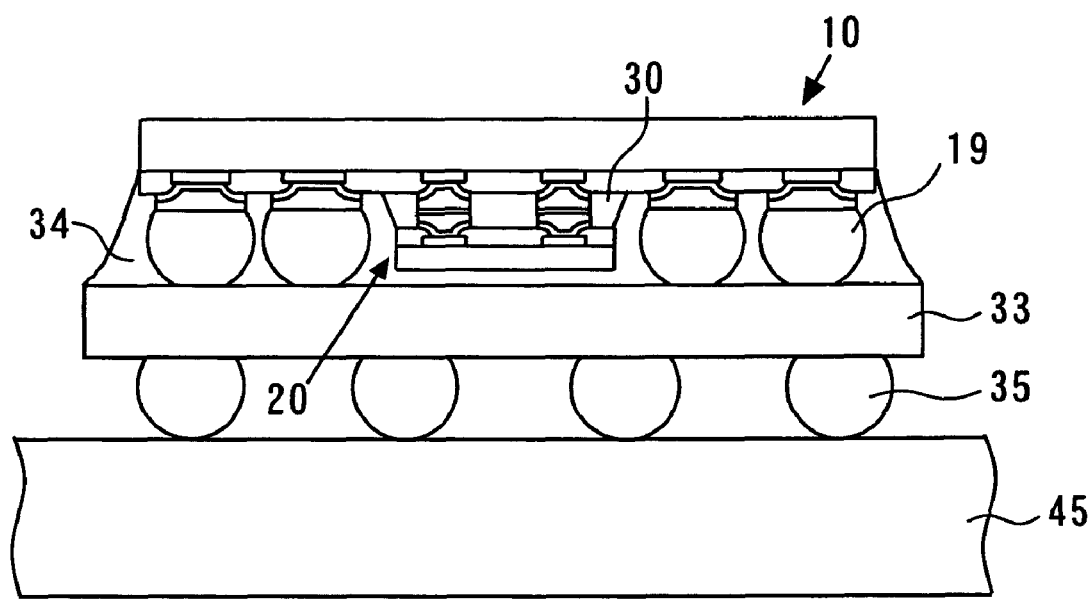
FIG. 26 is a sectional view showing a step of connecting the completed semiconductor device on a motherboard wiring substrate of an electronic device through outer balls 35.

As shown in FIG. 25, the Au film 28 on the metal posts 26 of the daughter chip 20 is a material having a high melting point such as to remain in the solid state even when the daughter chip 20 is heated to a temperature equal to or higher than the melting point of the solder film 17, e.g., 300° C. in this embodiment, because the Au film 28 is a high. The solder film 17 on the metal posts 16 of the mother chip 10 also remains in the solid state before contact with the Au film 28 of the daughter chip 20 since the mother chip 10 is preheated to a temperature lower than the melting point of the solder balls 19, e.g., 150° C. in this embodiment. When in such a state the Au film 28 heated to a temperature equal to or higher than the melting point of the solder film 17 and the solder film 17 preheated to a temperature equal to or lower than the melting point are brought into contact with each other, the solder film 17 is partially heated from a temperature equal to or higher than the melting point from its portion in contact with the Au film 28 to be melted. A load is then applied between the metal posts 16 and 26 to cause the solder film 17 to flow well. In particular, application of a load to the metal posts 16 and 27 is continued during the progress of melting of the solder film 17 by heat conduction from the Au film 28 to break the oxide film in the surface of the solder film 17 and to cause the solder film 17 to flow successively from the molten portion. Preferably, the magnitude of the load to be applied in the joining step is such that at least a load equal to or larger than the weight of the daughter chip 20 is applied as the sum total of loads received by the entire Au film 28-solder film 17 interface. That is, in the step of bringing the Au film 28 heated to a temperature equal to or higher than the melting point of the solder film 17 and the solder film 17 preheated to a temperature equal to or lower than the melting point into contact with each other, it is preferable to apply a load from the handler 32 to the back surface of the daughter chip 20. Thus, even in a case where a thick oxide film is formed in the surface of the solder film 17, the oxide film can be broken with reliability at the time of chip-on-chip connection. The magnitude of the load is not particularly specified. However, it is preferable to apply at least 10 mg per one electrode. In this embodiment, a load of 2 kg or more is applied to the daughter chip 20 back surface when the number of electrodes for connection between the daughter chip 20 and the mother chip 10 is 10000. If a load of 200 mg or more is applied per one electrode at the time of electrode contact as in this embodiment, breakage of the oxide film formed in the surface of the solder film 17 in the solid state can be induced and the flowability of the solder film 17 at the time of melting the solder film 17 can be further improved. After the chip-on-chip connection step, an underfill resin is injected into the space between the mother chip 10 main surface and the daughter chip 20 main surface, as in the first embodiment. It is preferable to set the distance between the mother chip 10 main surface and the daughter chip 20 main surface to 10 μm or more in order to facilitate injection of the underfill resin 30 into the space between the chips in the chip-on-chip construction, as in the first embodiment. With respect to the daughter chip 20 whose thickness is reduced to a chip thickness of 100 μm or less by wafer back surface grinding as described above, it is preferable to reduce the height of the projecting electrodes on the chip main surface in reducing stress from the back grinding tape at the time of separation. Thus, in this embodiment, the height of the projecting electrodes projecting on the mother chip 10 main surface is increased relative to the projecting electrodes projecting on the daughter chip 20 main surface, thereby further improving the productivity of the entire semiconductor device manufacturing process. After the chip-on-chip connection step, the mother chip 10 is flip-chip-connected on the circuit substrate 33 to complete the semiconductor device, as shown in FIG. 8. The completed semiconductor device is connected on a mother board wiring substrate 45 of an electronic device, e.g., a system board of a network server through outer balls 35 provided as external connection terminals of the semiconductor device, as shown in FIG. 26.

It is preferred that the oxide film in the surface of the solder film 17 be thinner. It is, therefore, preferable to performs one of the processes in the first to third embodiments that prevents the formation of a thick oxide film in the solder surface on the metal posts in the reflow step for joining solder balls onto the peripheral electrodes of the mother chip. This embodiment has been described with respect to a case where the diameter of each metal post 16 and the diameter of each metal post 26 are equal to each other. However, this embodiment is not limited to the described case. For example, if the area of each metal post 26 and the Au film 28 as seen in plan is larger than that of each metal post 16 and the solder film 17, the area through which the solder film 17 wets the Au film 28 can be increased. This is advantageous in obtaining the desired junction strength. In some cases of performing thermocompression bonding while applying a load, there is a possibility of the molten solder film 17 flowing to protrude from the position between the metal post 16 and the Au film 28. Advantageously, even in such a case, the protruding solder film 17 wets and spreads on the portion of the Au film 28 projecting on the periphery of the metal post 16, thus preventing solder leakage between adjacent electrodes.

Eighth Embodiment

Figure 27A:
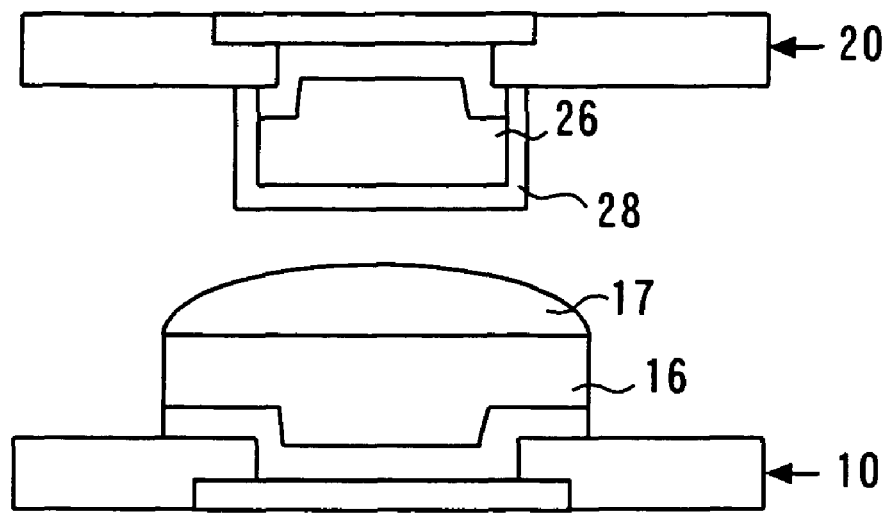
FIGS. 27A and 27B are sectional views of a junction between metal posts according to an eighth embodiment of the present invention.

In an eighth embodiment of the present invention, as shown in FIG. 27A, the lateral width of the metal posts 16 of the mother chip 10 is increased relative to that of the metal posts 26 of the daughter chip 20; Au film 28 is formed on upper and side surfaces of each metal post 26; and solder film 17 is formed on each metal post 16. In other respects, the arrangement is the same as that in the seventh embodiment.

This arrangement provides a space for receiving the material of the solder film 17 flowing out from the position between each pair of metal post 16 and metal post 26 by the pressure applied at the time of joining. Protrusion of the solder film 17 from the position between each pair of metal posts is thereby limited to prevent leakage to other metal posts or other portions.

Figure 27B:
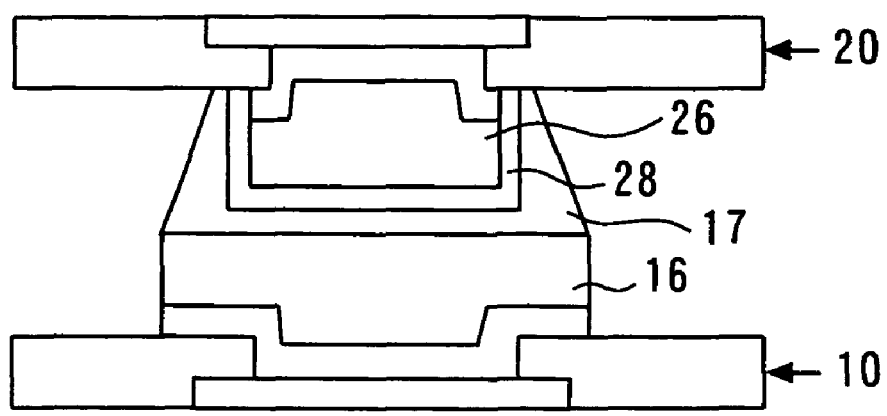

As shown in FIG. 27B, the solder film 17 wets and spreads on the side surface of the metal post 26. Thus, a certain solder film 17 wetting area is provided to improve the junction strength. Protrusion of the solder film 17 from the position between the metal posts can be further limited.

The temperature of the metal post 26 on which the Au film 28 is formed can be increased relative to that of the metal post 16. Therefore, the oxide film in the surface of the solder film 17 can be broken with reliability at the time of flip-chip connection, as in the seventh embodiment.

Figure 28A:
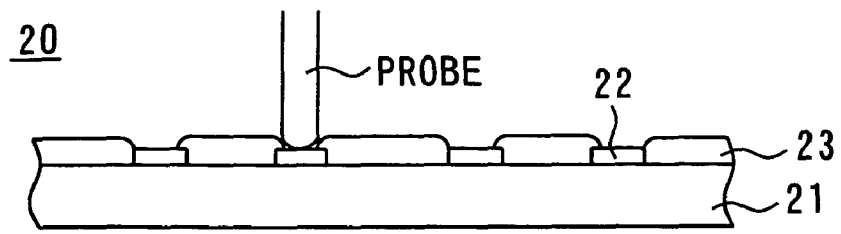
FIGS. 28A to 28D are sectional views showing a process of forming a daughter chip according to the eighth embodiment of the present invention.

A process of forming the daughter chip having the above-described structure will be described. As shown in FIG. 28A, Al electrodes 22 are first formed on a substrate 21 (circuit surface) and other regions are covered with surface protective film 23. An inspection is made by applying a probe to the Al electrodes 22. This inspection is made on each of a plurality of daughter chips 20 formed on the wafer, and a wafer map indicating the nondefective/defective state of each daughter chip 20 on the wafer is made.

Figure 28B:
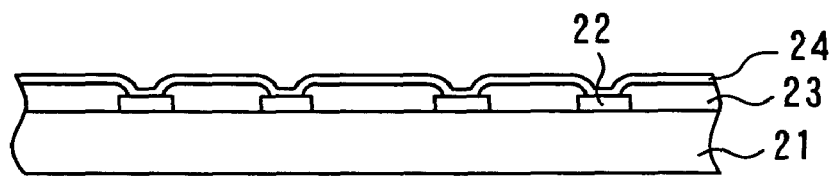
Figure 28C:
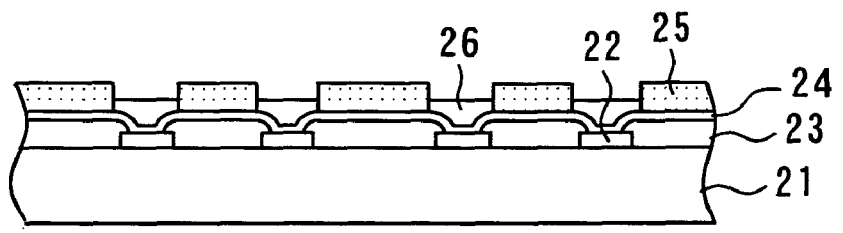
Figure 28D:
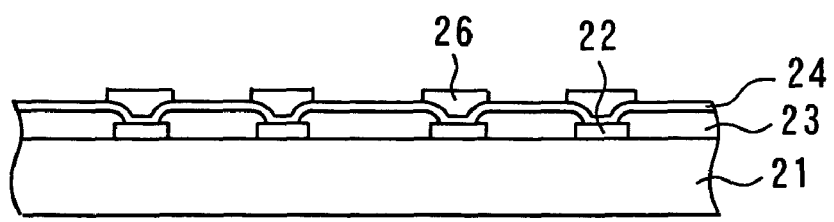

Subsequently, as shown in FIG. 28B, barrier metal 24 in multilayer form comprising Ti, Cu, Ni, Cr and W for example is formed on the entire surface by a sputtering technique or a plating technique for example. As shown in FIG. 28C, a resist 25 having openings corresponding to regions where the Al electrodes 22 exist is formed, and metal posts 26 are formed by filling the openings in the resist 25 with Ni film by a plating technique. Thereafter, the resist 25 is removed, as shown in FIG. 28D.

Figure 29A:
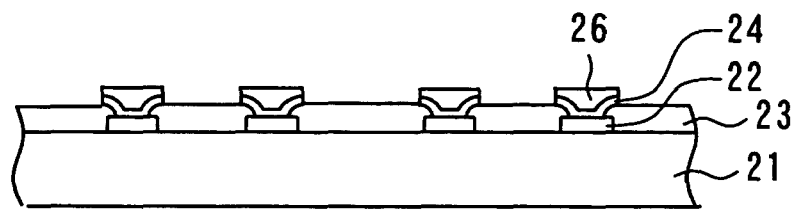
FIGS. 29A to 29D are sectional views showing the process of forming the daughter chip according to the eighth embodiment of the present invention.
Figure 29B:
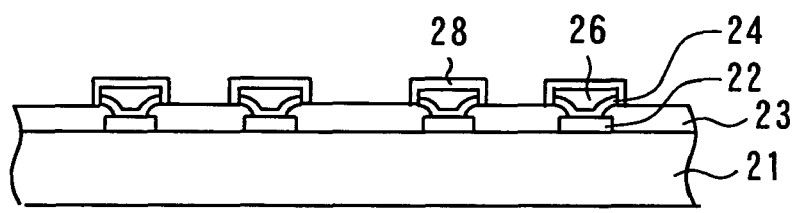

Subsequently, as shown in FIG. 29A, the barrier metal 24 is etched by anisotropic etching, with the metal posts 26 used as a mask. As shown in FIG. 29B, activation processing is performed on the surfaces of the metal posts 26 and Au film 29 is thereafter formed on upper and side surfaces of the metal posts 26 by nonelectrolytic plating.

Figure 29C:
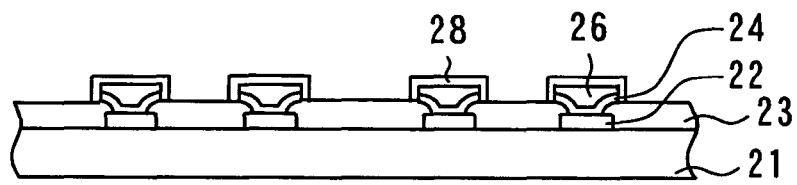

Subsequently, as shown in FIG. 29C, wafer back surface grinding is performed until the wafer thickness is reduced to a predetermined value of, for example, 30 to 50 μm.

Figure 29D:
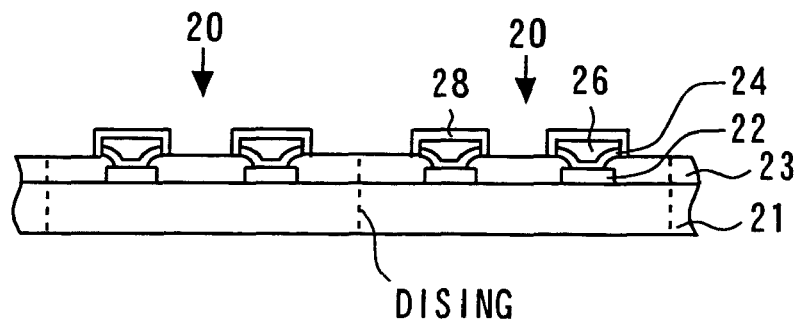

Subsequently, as shown in FIG. 29D, the plurality of daughter chips 20 formed on the wafer are individually separated by dicing. An appearance inspection is thereafter performed (step S18). The daughter chip 20 is formed by the above-described process.

Ninth Embodiment

In a ninth embodiment of the present invention, Ni is used as the material of the metal posts 16 of the mother chip 10 and the material of the metal posts 26 of the daughter chip 20. Au film 28 is formed on the surfaces of the metal posts 26, while solder film 17 is formed on the metal posts 16. In other respects, the arrangement is the same as that in the seventh embodiment.

In the case where Ni is used as the material of the metal posts 26 of the daughter chip 20, the rate of growth of the Ni—Sn alloy is low. The distance between the metal posts 16 of the mother chip 10 and the metal posts 26 of the daughter chip 20 is reduced to 5 μm or less, as in the fifth embodiment, thereby ensuring that SnNi alloy bridges can be formed with reliability, and preventing a considerable reduction in junction strength due to successive formation of voids in stratum even in a case where diffusion voids are generated along the interface. Thus, the high-temperature reliability can be improved.

Figure 30A:
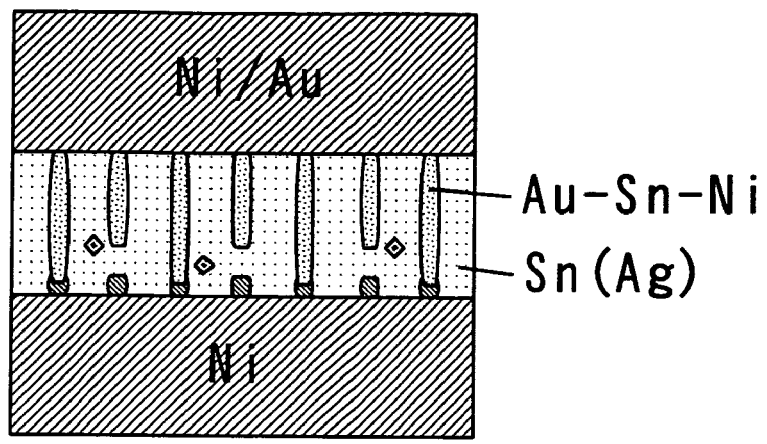
FIGS. 30A to 30C are sectional views of a Ni/Au post and a Ni post neat a junction therebetween.
Figure 30B:
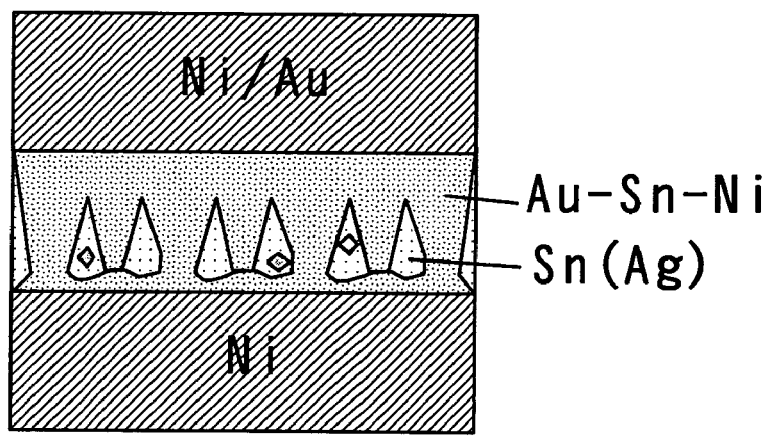
Figure 30C:
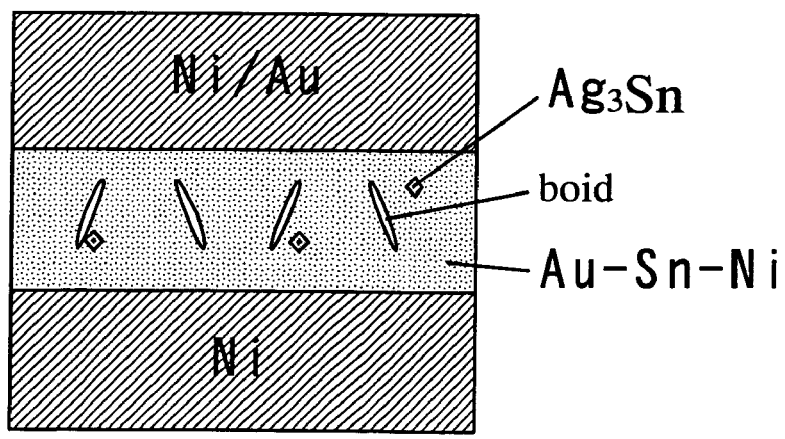

Detailed description will further be made of the alloy formation at the interface between the metal posts. FIGS. 30A to 30C are sectional views of the Ni/Au post obtained by forming Au film 28 on the Ni film 26 and the Ni post formed of Ni film 16 near the junction through the solder film 17 in initial, middle and late stages. The rate of formation of an Au—Sn—Ni alloy is higher than that that of the $Ni_3Sn_4$ alloy. Therefore, Au—Sn—Ni alloy bridges are easily formed between the posts. As a result, void formation in a portion where Sn (Ag) is left is limited. A change in the amount of Au due to variation in Au film thickness is large with respect to the amount of Sn (Ag), and the thickness of an Au—Sn—Cu—Ni alloy layer solidifying at the time of post joining varies. In a case where the alloy layer is thick, the distance between the posts cannot be reduced and there is a possibility of occurrence of junction failure. Therefore, it is preferable to limit the excessive growth of the alloy by setting the film thickness of the Au film 28 to 0.1 μm or less.

Tenth Embodiment

Figure 31A:
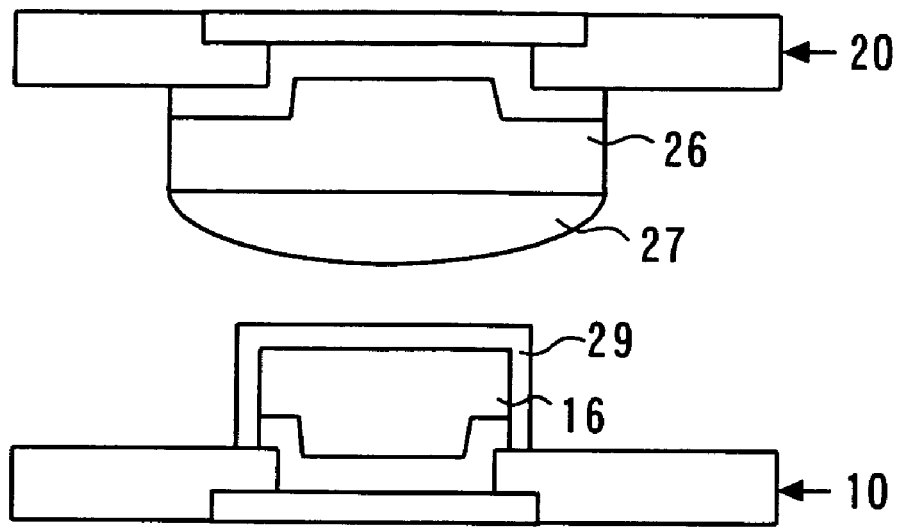
FIGS. 31A and 31B are sectional views of a junction between metal posts according to a tenth embodiment of the present invention.

In a tenth embodiment of the present invention, as shown in FIG. 31A, the lateral width of the metal posts 16 of the mother chip 10 is reduced relative to that of the metal posts 26 of the daughter chip 20; Au film 29 is formed on upper and side surfaces of each metal post 16 smaller in lateral width; and solder film 27 is formed on each metal post 26.

This arrangement provides a space for receiving the material of the solder film 27 flowing out from the position between each pair of metal post 16 and metal post 26 by the pressure applied at the time of joining. Protrusion of the solder film 27 from the position between each pair of metal posts is thereby limited to prevent leakage to other metal posts or other portions.

Figure 31B:
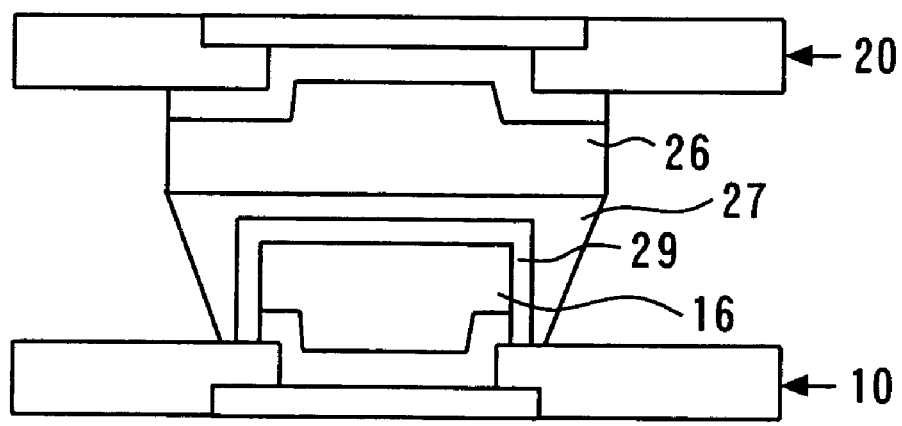

As shown in FIG. 31B, the solder film 27 wets and spreads on the side surface of the metal post 16. Thus, a certain solder film 27 wetting area is provided to improve the junction strength. Protrusion of the solder film 27 from the position between the metal posts can be further limited.

Figure 32A:
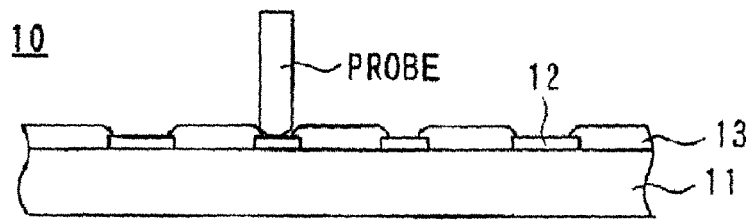
FIGS. 32A to 32E are sectional views showing a process of forming a mother chip according to the tenth embodiment of the present invention.

A process of forming the mother chip having the above-described structure will be described. As shown in FIG. 32A, Al electrodes 12 are first formed on a substrate 11 (circuit surface) and other regions are covered with surface protective film 13. An inspection is made by applying a probe to the Al electrodes 12. This inspection is made on each of a plurality of mother chips 10 formed on the wafer, and a wafer map indicating the nondefective/defective state of each mother chip 10 on the wafer is made.

Figure 32B:
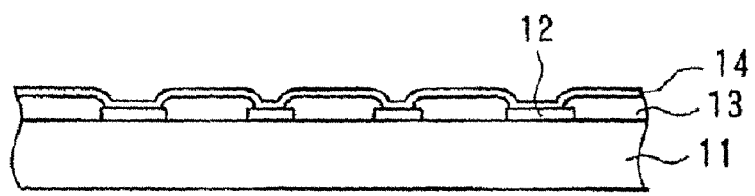
Figure 32C:
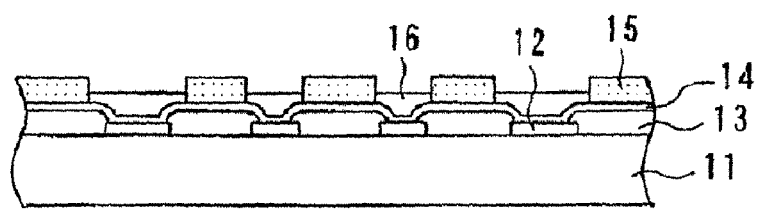
Figure 32D:
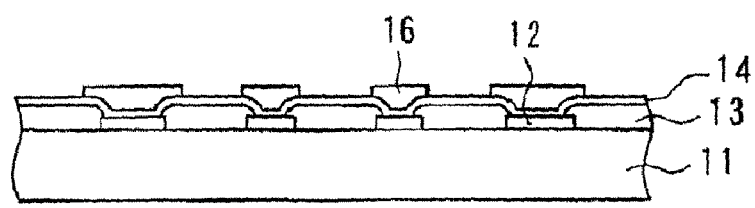
Figure 32E:
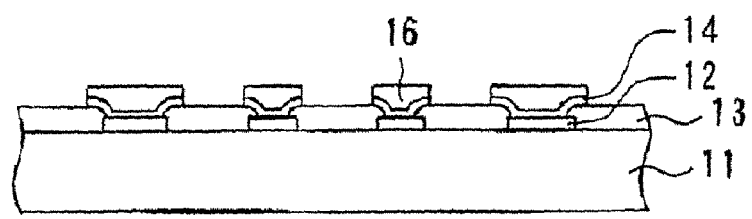

Subsequently, as shown in FIG. 32B, barrier metal 14 in multilayer form comprising Ti, Cu, Ni, Cr and W for example is formed on the entire surface by a sputtering technique or a plating technique for example. As shown in FIG. 32C, a resist 15 having openings corresponding to regions where the Al electrodes 12 exist is formed, and metal posts 16 are formed by filling the openings in the resist 15 with Cu for example by a plating technique. Thereafter, the resist 15 is removed, as shown in FIG. 32D. As shown in FIG. 32E, the barrier metal 14 is then etched by anisotropic etching, with the metal posts 16 used as a mask.

Figure 33A:
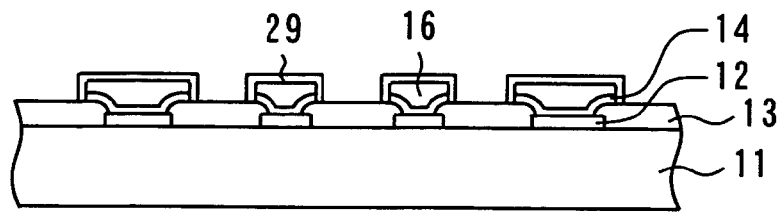
FIGS. 33A to 33D are sectional views showing the process of forming the mother chip according to the tenth embodiment of the present invention.

As shown in FIG. 33A, activation processing is performed on the surfaces of the metal posts 16 and Au film 28 is thereafter formed on upper and side surfaces of the metal posts 16 by nonelectrolytic plating for example.

Figure 33B:
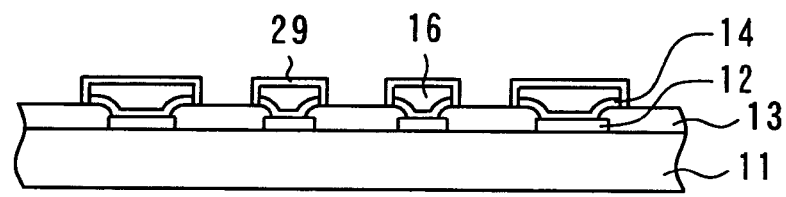

Subsequently, as shown in FIG. 33B, wafer back surface grinding is performed until the wafer thickness is reduced to a predetermined value of, for example, 200 to 600 μm.

Figure 33C:
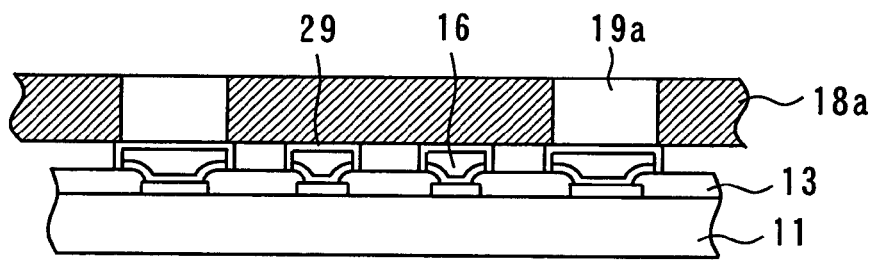

Subsequently, as shown in FIG. 33C, a metal mask 18a having openings in regions where solder balls (described below) are to be formed is formed, and a solder paste 19a is printed on the mother chip 10 by filling the openings of the metal mask 18a with the solder paste.

Figure 33D:
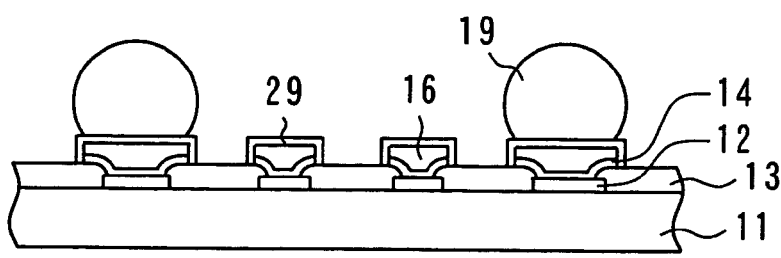

Subsequently, as shown in FIG. 33D, the metal mask 18a is removed, and the mother chip 10 is heated so that the solder paste 19a is reflowed (molten) to form solder balls 19. Cleaning and an appearance inspection are thereafter performed. The mother chip 10 is formed by the above-described process.

Thereafter, the metal posts of the mother chip and the metal posts of the daughter chip are bonded to each other by means of the solder film in a thermocompression bonding manner, and the mother chip is flip-chip-connected on a circuit substrate by using the solder balls.

In this embodiment, no solder film is formed on the metal posts 16 of the mother chip 10. Therefore, this embodiment is free from the problem that a thick film is formed in the surface of the solder film by reflowing for forming solder balls 19 to cause failure of connection between the mother chip and the daughter chip.

Eleventh Embodiment

Figure 34:
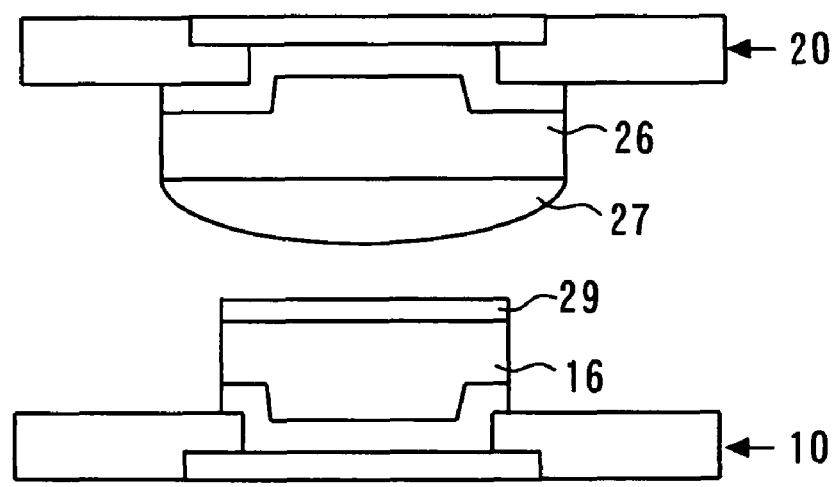
FIG. 34 is a sectional view of a junction between metal posts according to an eleventh embodiment of the present invention.

In an eleventh embodiment of the present invention, as shown in FIG. 34, the lateral width of the metal posts 16 of the mother chip 10 is reduced relative to that of the metal posts 26 of the daughter chip 20; Au film 29 is formed on an upper surface of each metal post 16; and solder film 27 is formed on each metal post 26. In other respects, the arrangement is the same as that in the tenth embodiment.

This arrangement provides a space for receiving the material of the solder film 27 flowing out from the position between each pair of metal post 16 and metal post 26 by the pressure applied at the time of joining. Protrusion of the solder film 27 from the position between each pair of metal posts is thereby limited to prevent leakage to other metal posts or other portions. However, the solder film 27 does not wet and spread on a side surface of the metal post 16 formed of Ni for example, because oxide film is formed on the side surface of the metal post 16.

Twelfth Embodiment

In a twelfth embodiment of the present invention, Ni is used as the material of the metal posts 16 of the mother chip 10, while Cu is used as the material of the metal posts 26 of daughter chip 20. Au film 28 is formed on the surfaces of the metal posts 16, while solder film 27 is formed on the metal posts 26. In other respects, the arrangement is the same as that in the tenth embodiment.

Figure 35A:
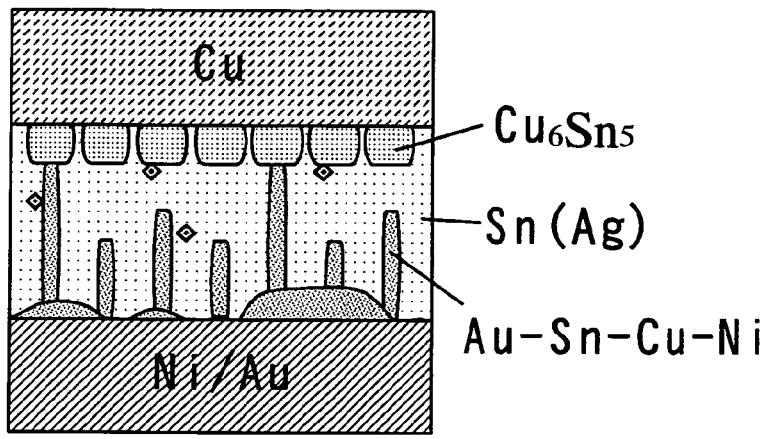
FIGS. 35A to 35C are sectional views of a Cu post and a Ni/Au post near a junction therebetween.
Figure 35B:
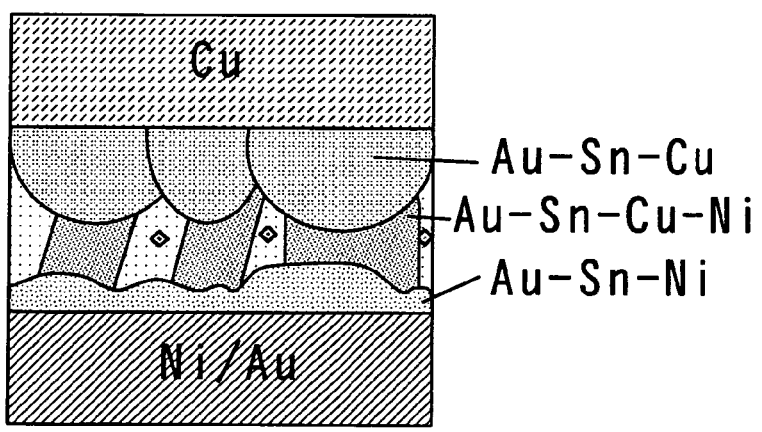
Figure 35C:
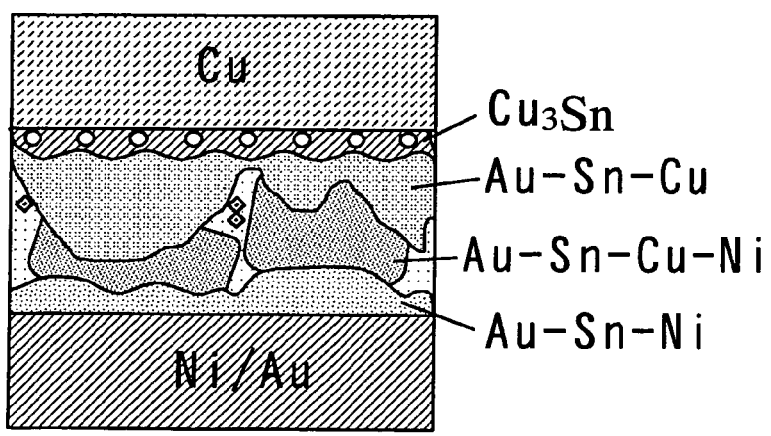

Detailed description will further be made of the alloy formation at the interface between the metal posts. FIGS. 35A to 35C are sectional views of the CU post and the Ni/Au post near the junction in initial, middle and late stages. The rate of diffusion of Au is high. Therefore, Au—Sn—Cu—Ni alloy bridges are easily formed between the posts. As a result, void formation in a portion where Sn (Ag) is left is limited. However, a change in the amount of Au due to variation in Au film thickness is large with respect to the amount of Sn (Ag), and the thickness of an Au—Sn—Cu—Ni alloy layer solidifying at the time of post joining varies. In a case where the alloy layer is thick, the distance between the posts cannot be reduced and there is a possibility of occurrence of junction failure. Therefore, it is preferable to limit the growth of the alloy by setting the film thickness of the Au film to 0.1 µm or less.

Thirteenth Embodiment

Figure 36A:
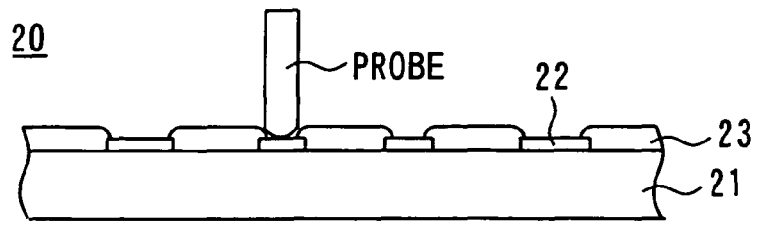
FIGS. 36A to 36F are sectional views showing a process of forming a daughter chip according to a thirteenth embodiment of the present invention.

A process of forming a daughter chip according to a thirteenth embodiment of the present invention will be described. As shown in FIG. 36A, Al electrodes 22 are first formed on a substrate 21 (circuit surface) and other regions are covered with surface protective film 23. An inspection is made by applying a probe to the Al electrodes 22. This inspection is made on each of a plurality of daughter chips 20 formed on the wafer, and a wafer map indicating the nondefective/defective state of each daughter chip 20 on the wafer is made.

Figure 36B:
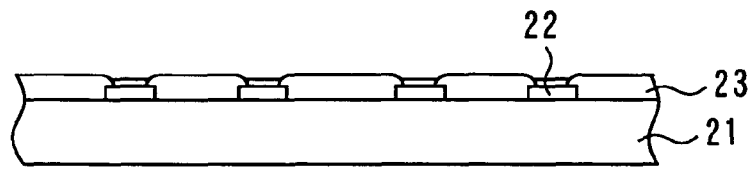
Figure 36C:
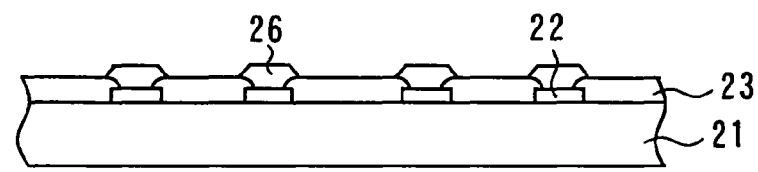

Subsequently, as shown in FIG. 36B, zincate processing is performed on the Al electrodes 22. Thereafter, as shown in FIG. 36C, metal posts 26 formed of Ni are formed on the Al electrodes 22 by nonelectrolytic plating.

Figure 36D:
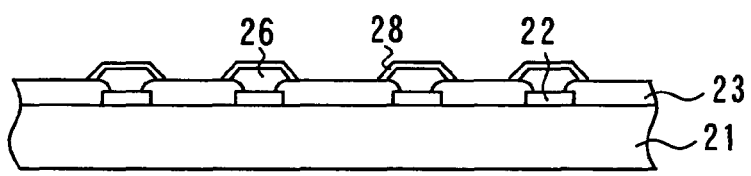
Figure 36E:
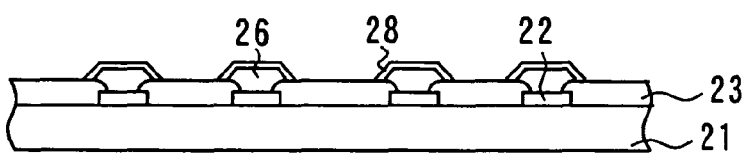

Subsequently, as shown in FIG. 36D, Au film 28 is formed on the surfaces of the metal posts 26 by nonelectrolytic plating. As shown in FIG. 36E, wafer back surface grinding is performed until the wafer thickness is reduced to a predetermined value of, for example, 30 to 300 µm.

Figure 36F:
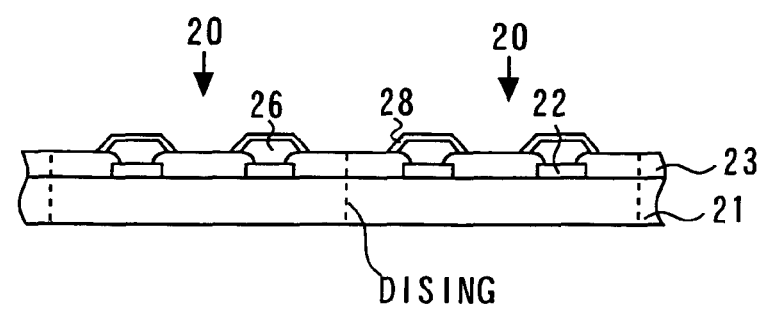

Subsequently, as shown in FIG. 36F, the plurality of daughter chips 20 formed on the wafer are individually separated by dicing. An appearance inspection is thereafter performed. The daughter chip 20 is formed by the above-described process. This process can also be applied to the formation of a mother chip.

If the metal posts are formed by nonelectrolytic plating as described above, the thickness of the metal posts can be reduced, so that the wafer thickness can be reduced, for example, to about 30 µm by wafer back surface grinding.

Also, there is no need to form a seed layer and no photolithography step is required. Therefore, the manufacturing cost can be reduced.

Fourteenth Embodiment

Figure 37A:
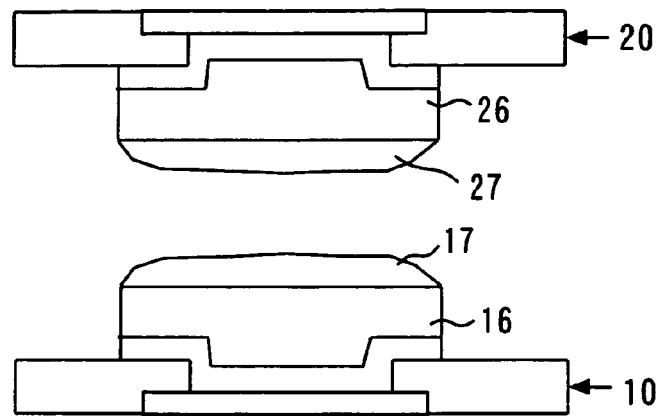
FIGS. 37A to 37C are sectional views showing a step of joining metal ports together according to a fourteenth embodiment of the present invention.
Figure 37B:
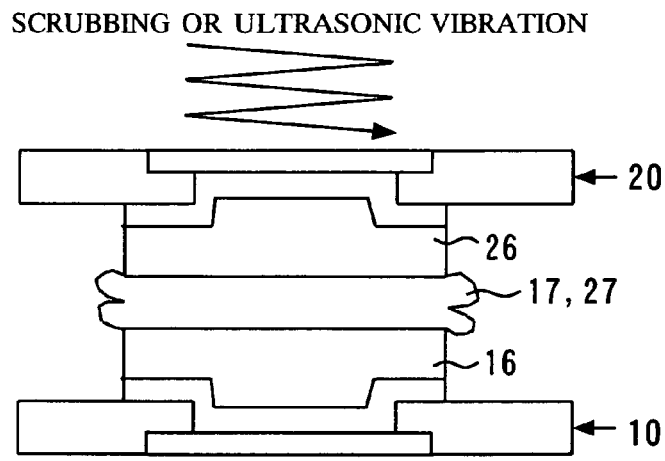

In a fourteenth embodiment of the present invention, the metal post 16 of the mother chip 10 and the metal post 26 of the daughter chip 20 are opposed to each other, as shown in FIG. 37A; not only heating and pressing but also scrubbing or ultrasonic vibration is applied to the daughter chip 20 to bond the metal post 16 and the metal post 26 in a thermocompression bonding manner by means of the solder films 17 and 27, as shown in FIG. 37B. The oxide film in the surface of the solder films 17 and 27 can be broken with further improved reliability.

Figure 37C:
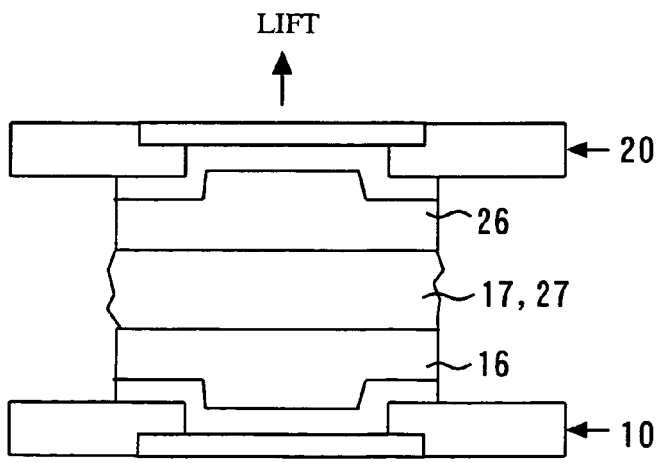

Subsequently, as shown in FIG. 37C, the daughter chip 20 is lifted after thermocompression bonding. The amounts of the materials of the solder films 17 and 27 flowing out from the position between the metal post 16 and the metal post 26 can be limited in this way to prevent leakage to other metal posts or other portions.

Fifteenth Embodiment

Figure 38:
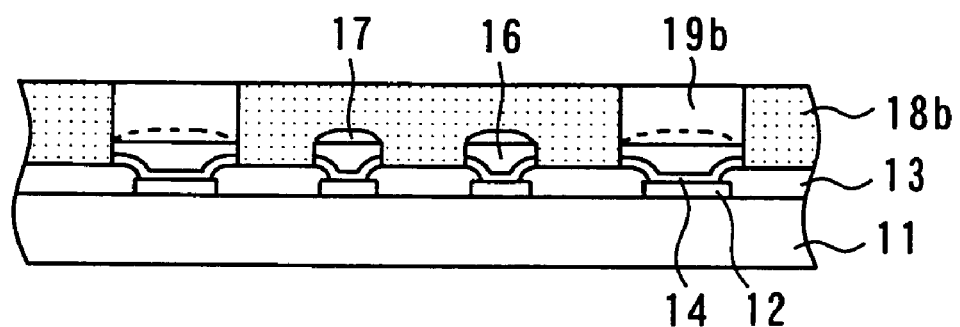
FIG. 38 is a sectional view showing a process of forming a mother chip according to a fifteenth embodiment of the present invention.

In a fifteenth embodiment of the present invention, the same steps as steps S1 to S6 in the first embodiment are first performed when the mother chip 10 is formed. Subsequently, as shown in FIG. 38, a resist 18b having openings corresponding to regions where solder balls are to be formed is formed, and the openings of the resist 18b are filled with solder film 19b by a plating technique for example. The resist 18b is thereafter removed, a flux is applied, and the mother chip 10 is heated in an $N_2$ reflow furnace, an $N_2+H_2$ reflow furnace or the like to reflow the solder film 19b, thus forming solder balls. The other steps are the same as those in the other embodiments.

Sixteenth Embodiment

Figure 39:
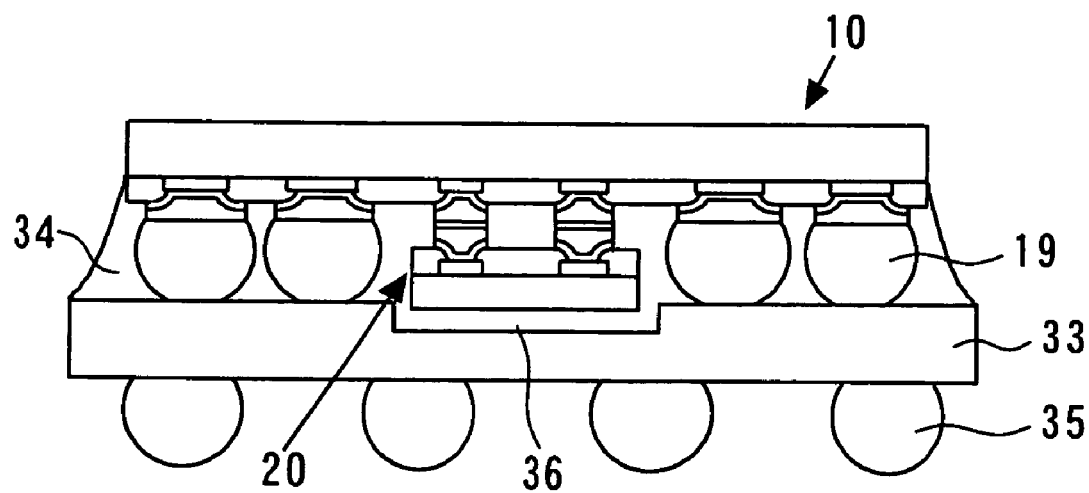
FIG. 39 is a sectional view of a state in which the mother chip according to a sixteenth embodiment of the present invention is flip-chip-connected to a circuit substrate.

In a sixteenth embodiment of the present invention, as shown in FIG. 39, a recess 36 is formed in a region in an upper surface of a circuit substrate 33 corresponding to the daughter chip 20. The structure of the recess 36 can be formed, for example by removing a portion of an insulating film formed on the uppermost surface of the circuit substrate, i.e., a solder resist film, corresponding to the daughter chip 20. In other respects, the arrangement is the same as those in the other embodiments. This arrangement ensures that even if the thickness of the daughter chip 20 is large, for example, 50 to 300 µm, the mother chip 10 and the circuit substrate 33 can be suitably flip-chip-connected. Also, the distance between the mother chip 10 main surface and the daughter chip 20 main surface can be set sufficiently large without being restricted by the height of solder balls 19. If the distance between the mother chip 10 main surface and the daughter chip 20 main surface is sufficiently large, it is also possible to fill the space between the mother chip 10 main surface and the daughter chip 20 main surface with underfill resin 34. This means that the need for the step of injecting the underfill resin into the space between the chips in the chip-on-chip construction can be eliminated to improve the productivity. Increasing the distance between the mother chip 10 main surface and the daughter chip 20 main surface requires increasing the heights of the metal posts 16 and 26 formed on the chips. If the height of the metal posts formed of Ni film is increased to 5 µm or higher, there is a possibility of the reliability and electric characteristics of the semiconductor device being badly influenced by stress in Ni film and resistance of Ni film. Therefore, in a case where the height of the metal posts 16 and 26 formed on the chips is increased to 10 μm or higher, it is preferable to use Cu film formed by electrolytic plating.

Seventeenth Embodiment

In a seventeenth embodiment of the present invention, Al electrodes are formed in place of solder balls 19, and the Al electrodes of the mother chip 10 and electrodes on a circuit substrate 33 are connected by wire bonding junctions. In other respects, the arrangement is the same as that in the first embodiment. As a result, the need for reflowing for forming solder balls is eliminated and formation of a thick oxide film in the surface of the solder film 17 is prevented, thus enabling prevention of failure of contact between the mother chip and the daughter chip. A metal lead frame can also be used in place of the circuit substrate 33.

Obviously many modifications and variations of the present invention are possible in the light of the above teachings. It is therefore to be understood that within the scope of the appended claims the invention may be practiced otherwise than as specifically described.

The entire disclosure of a Japanese Patent Application No. 2005-361371, filed on Dec. 15, 2005 including specification, claims, drawings and summary, on which the Convention priority of the present application is based, are incorporated herein by reference in its entirety.

What is claimed is:

1. A method of manufacturing a semiconductor device, comprising:
    a first step of forming a solder film on metal posts of a mother chip;
    a second step of forming solder balls after the first step by printing a solder paste on the mother chip and heating the mother chip so that the solder paste is reflowed;
    a third step of bonding the metal posts of the mother chip and metal posts of a daughter chip to each other in a thermocompression bonding manner by means of the solder film after the second step; and
    a fourth step of flip-chip-connecting the mother chip on a circuit substrate by using the solder balls,
    wherein in the second step the mother chip is heated in a nitrogen atmosphere in which the oxygen concentration is 500 ppm or less, and
    wherein when the metal posts of the mother chip and the metal posts of the daughter chip are bonded in a thermocompression bonding manner by means of the solder film, the daughter chip is heated to a temperature higher than a melting point of the solder film, and a temperature of the mother chip is set lower than a melting point of the solder balls.

2. A method of manufacturing a semiconductor device, comprising:
    a first step of preparing first bumps having a solder film formed on a metal film on a mother chip;
    a second step of reflowing the solder film of the first bumps by heating the mother chip; and
    a third step of bonding the solder film on the mother chip and second bumps of a daughter chip to each other in a thermocompression bonding manner by means of the solder film after the second step,
    wherein in the second step the mother chip is heated in a nitrogen atmosphere in which the oxygen concentration is 500 ppm or less, and
    wherein when the first bumps of the mother chip and the second bumps of the daughter chip are bonded to each other in a thermocompression bonding manner by means of the solder film, the daughter chip is heated to a temperature higher than a melting point of the solder film, and the first bumps and the second bumps are brought into contact with each other in a state where a temperature of the mother chip is set lower than the melting point of the solder film.

3. A method of manufacturing a semiconductor device, comprising:
    a first step of preparing first bumps having a solder film formed on a metal film on a mother chip;
    a second step of reflowing the solder film of the first bumps by heating the mother chip; and
    a third step of bonding the solder film on the mother chip and second bumps of a daughter chip to each other in a thermocompression bonding manner by means of the solder film after the second step,
    wherein in the second step the mother chip is heated in a nitrogen atmosphere in which the oxygen concentration is 500 ppm or less, and
    wherein the second bumps of the daughter chip have a metal film, and a diameter of a cross section of the metal film on the mother chip cut along a plane parallel to the mother chip and a diameter of a cross section of the metal film on the daughter chip cut along a plane parallel to the daughter chip are different from each other.

4. A method of manufacturing a semiconductor device, comprising:
    a first step of preparing first bumps having a solder film formed on a metal film on a mother chip;
    a second step of reflowing the solder film of the first bumps by heating the mother chip; and
    a third step of bonding the solder film on the mother chip and second bumps of a daughter chip to each other in a thermocompression bonding manner by means of the solder film after the second step,
    wherein in the second step the mother chip is heated in a nitrogen atmosphere in which the oxygen concentration is 500 ppm or less, and
    wherein the second bumps of the daughter chip have a metal film, and in the step of bonding the first bumps of the mother chip and the second bumps of the daughter chip to each other in a thermocompression bonding manner by means of the solder film, the metal film on the mother chip and the metal film on the daughter chip are bridged by an alloy formed in the solder film.

* * * * *